US012795898B2

(12) United States Patent
Lee et al.

(10) Patent No.: US 12,795,898 B2
(45) Date of Patent: Nov. 10, 2026

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Hongjun Lee, Suwon-si (KR); Keunnam Kim, Suwon-si (KR); Kiseok Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 387 days.

(21) Appl. No.: 18/460,522

(22) Filed: Sep. 1, 2023

(65) Prior Publication Data

US 2024/0292601 A1 Aug. 29, 2024

(30) Foreign Application Priority Data

Feb. 23, 2023 (KR) ........................ 10-2023-0024392

(51) Int. Cl.
*H10B 12/00* (2023.01)

(52) U.S. Cl.
CPC ........... *H10B 12/482* (2023.02); *H10B 12/05* (2023.02); *H10B 12/485* (2023.02)

(58) Field of Classification Search
CPC .... H10B 12/482; H10B 12/05; H10B 12/485; H10B 12/315; H10B 12/033; H10B 12/34; H10B 12/053; H10B 12/488; H10P 50/692; H10P 50/71
See application file for complete search history.

(56) References Cited

U.S. PATENT DOCUMENTS

| | | | | |
|---|---|---|---|---|
| 7,622,348 | B2 | 11/2009 | Pan | |
| 7,710,756 | B2 | 5/2010 | Terzioglu et al. | |
| 7,745,867 | B2 | 6/2010 | Houston | |
| 9,230,612 | B2 | 1/2016 | Park | |
| 9,355,865 | B2 | 5/2016 | Tsai et al. | |
| 9,418,998 | B2 | 8/2016 | Kim et al. | |
| 9,553,027 | B2 | 1/2017 | Kim et al. | |
| 9,685,332 | B2 | 6/2017 | Chen et al. | |
| 10,096,603 | B2 | 10/2018 | Kim et al. | |
| 10,665,592 | B2 * | 5/2020 | Song ...................... | H10B 12/30 |
| 10,832,908 | B2 | 11/2020 | LaVoie | |
| 11,270,885 | B2 | 3/2022 | Lee et al. | |
| 2019/0164975 | A1 | 5/2019 | Song et al. | |
| 2021/0408004 | A1 | 12/2021 | Han et al. | |
| 2022/0085028 | A1 | 3/2022 | Choe et al. | |

FOREIGN PATENT DOCUMENTS

| | | | |
|---|---|---|---|
| KR | 10-2021-0037211 | A | 4/2021 |
| KR | 10-2022-0037170 | A | 3/2022 |

* cited by examiner

*Primary Examiner* — David Vu
(74) *Attorney, Agent, or Firm* — MORGAN, LEWIS & BOCKIUS LLP

(57) ABSTRACT

A semiconductor device includes a substrate including an active region, a word line and a bit line that overlap the active region while crossing the active region, a bit line capping layer that is disposed on the bit line, a direct contact that connects the active region and the bit line, and a buried contact that is connected to the active region. Opposite sides of the bit line capping layer have asymmetric shapes.

15 Claims, 43 Drawing Sheets

SEMICONDUCTOR DEVICE AND METHOD FOR MANUFACTURING THE SAME

CROSS-REFERENCE TO RELATED APPLICATION

This application claims priority to and the benefit of Korean Patent Application No. 10-2023-0024392 filed in the Korean Intellectual Property Office on Feb. 23, 2023, the entire contents of which are herein incorporated by reference.

TECHNICAL FIELD

The present disclosure relates to semiconductors and, more specifically, to a semiconductor device and a manufacturing method thereof.

DISCUSSION OF THE RELATED ART

A semiconductor is a material that has an electrical conductivity value between that of a conductor and an insulator. Semiconductors may conduct electricity under predetermined conditions. Various semiconductor devices can be manufactured using the semiconductor material, and for example, memory devices and the like can be manufactured. Such a semiconductor device can be used in various electronic devices.

According to the trend of shrinking device sizes and providing higher integration of electronic devices, circuit patterns that form a semiconductor device are being reduced in size. As the width of the fine pattern gradually decreases, the process difficulty increases and the defect rate of semiconductor devices may increase.

SUMMARY

A semiconductor device includes a substrate including an active region. A word line and a bit line overlap the active region. A bit line capping layer is disposed on the bit line. A direct contact connects the active region and the bit line. A buried contact is connected to the active region. Both sides of the bit line capping layer have asymmetric shapes.

A semiconductor device includes a substrate including an active region. A word line overlaps the active region. A bit line structure includes a bit line and a bit line capping layer overlapping the active region and the word line. A direct contact is disposed in a direct contact trench formed in the substrate and connects between the active region and the bit line. A buried contact is connected to the active region. A spacer structure is disposed between the bit line structure and the buried contact and between the direct contact and the buried contact. One side of the bit line capping layer has a concave shape, and the other side of the bit line capping layer has a flat shape.

A manufacturing method of a semiconductor device includes defining an active region by forming an element isolation layer in a substrate. An insulation layer and a first material layer are sequentially stacked on the substrate and then a direct contact trench is formed by patterning. A second material layer is formed in the direct contact trench. A third material layer, a fourth material layer, and a fifth material layer are sequentially stacked on the first material layer and the second material layer. Primary patterning is performed by etching at least parts of the fifth material layer, the fourth material layer, the third material layer, the second material layer, and the first material layer. A protective layer is formed to fill a portion removed by the primary patterning. A hard mask pattern is formed covering side surfaces of the protective layer and an upper surface of the fifth material layer adjacent to the protective layer. A direct contact connected to the active region and a bit line structure connected to the direct contact are formed through secondary patterning by performing etching at least some of the fifth material layer. The fourth material layer, the third material layer, the second material layer, and the first material layer are etched using the hard mask pattern as a mask. The protective layer s removed. A spacer covering side surfaces of the direct contact and the bit line structure is formed. A buried contact connected to the active region is formed.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
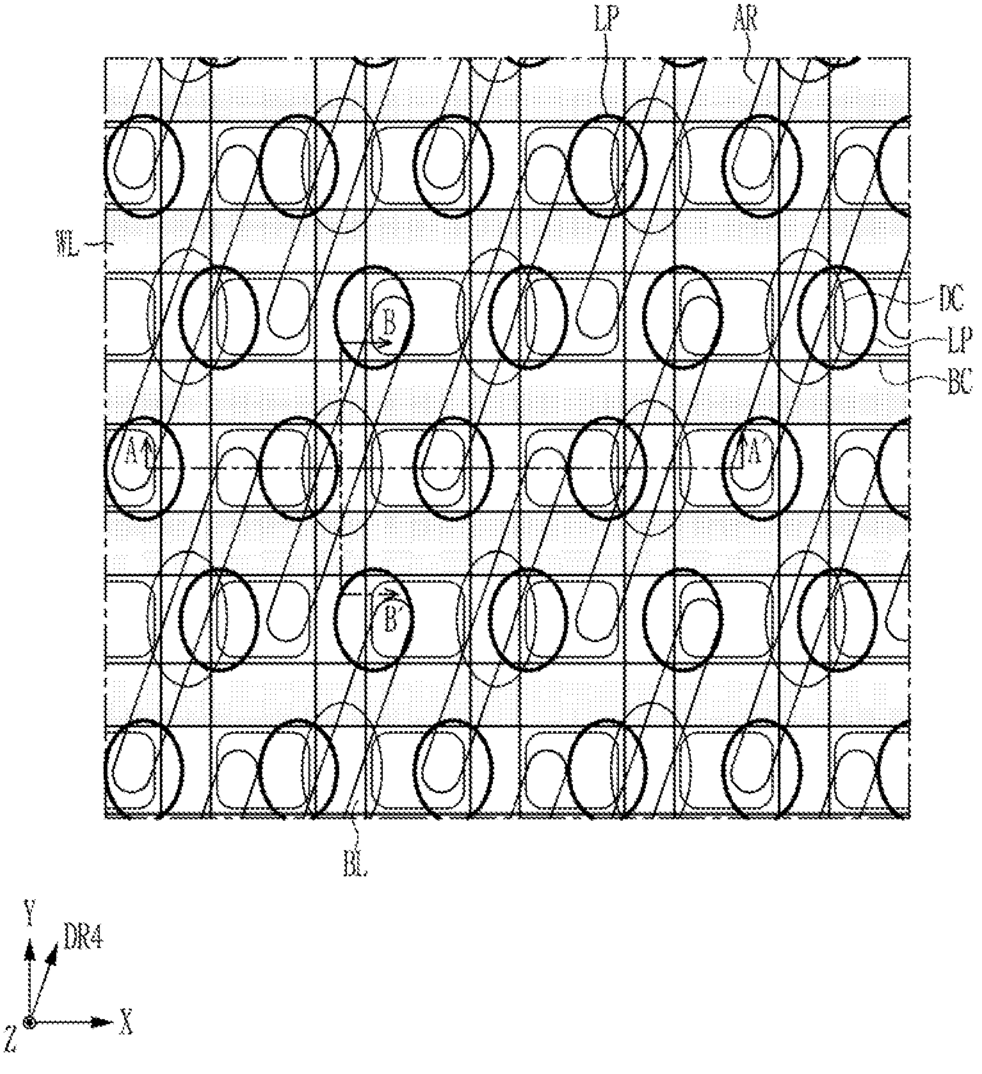
FIG. 1 is a top plan view of a semiconductor device according to an embodiment of the present disclosure.

Hereinafter, with reference to accompanying drawings, various embodiments will be described in detail and thus a person of an ordinary skill can easily practice them in the technical field to which the present invention belongs. The present invention may be embodied in many different forms and is not necessarily limited to the embodiments described herein.

In order to clearly explain the present invention, parts irrelevant to the description have been omitted, and the same reference numerals are used for the same or similar constituent elements throughout the specification and the figures.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" or "in a plan view" means viewing a target portion from the top, and the phrase "on a cross-section" means viewing a cross-section formed by vertically cutting a target portion from the side.

Hereinafter, referring to FIG. 1 to FIG. 3, a semiconductor device according to an embodiment will be described.

FIG. 1 is a top plan view of a semiconductor device according to an embodiment. FIG. 2 is a cross-sectional view of FIG. 1, taken along the line A-A'. FIG. 3 is a cross-sectional view of FIG. 1, taken along the line B-B'.

Figure 2:
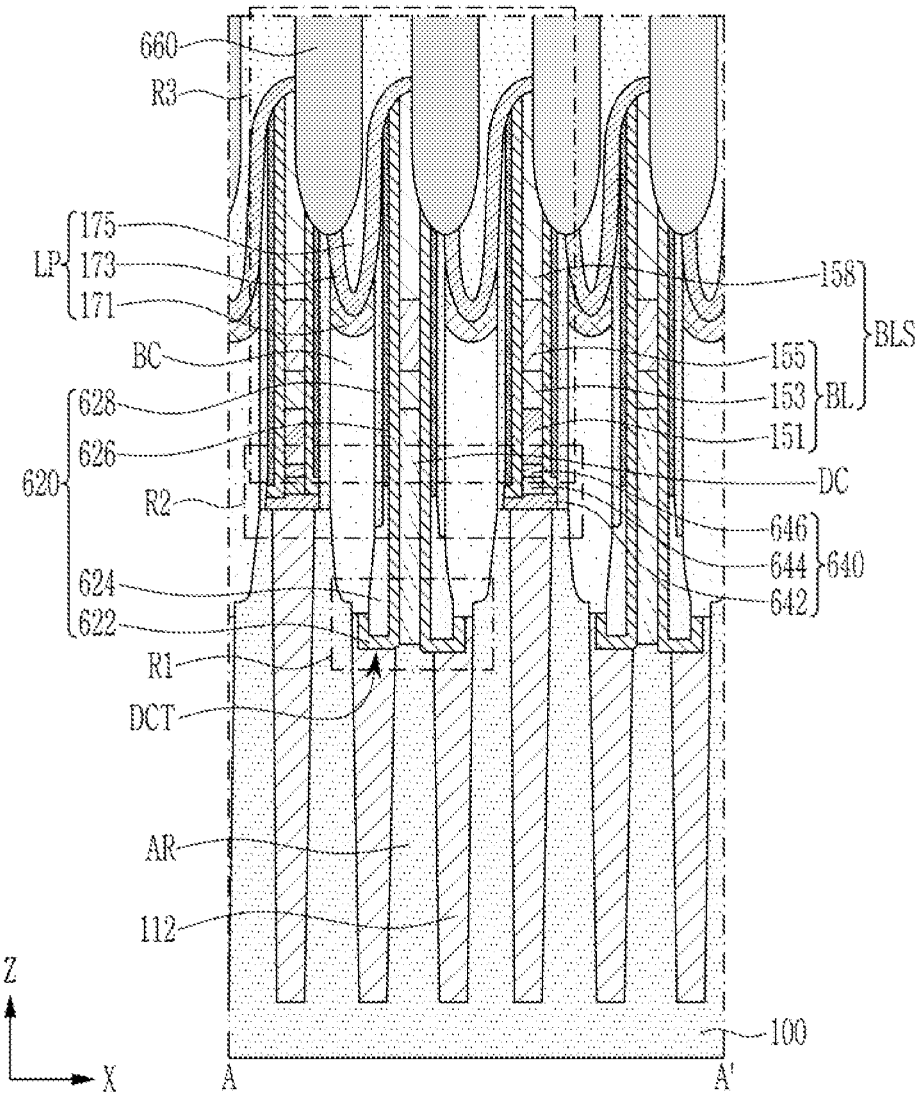
FIG. 2 is a cross-sectional view of FIG. 1, taken along the line A-A'.
Figure 3:
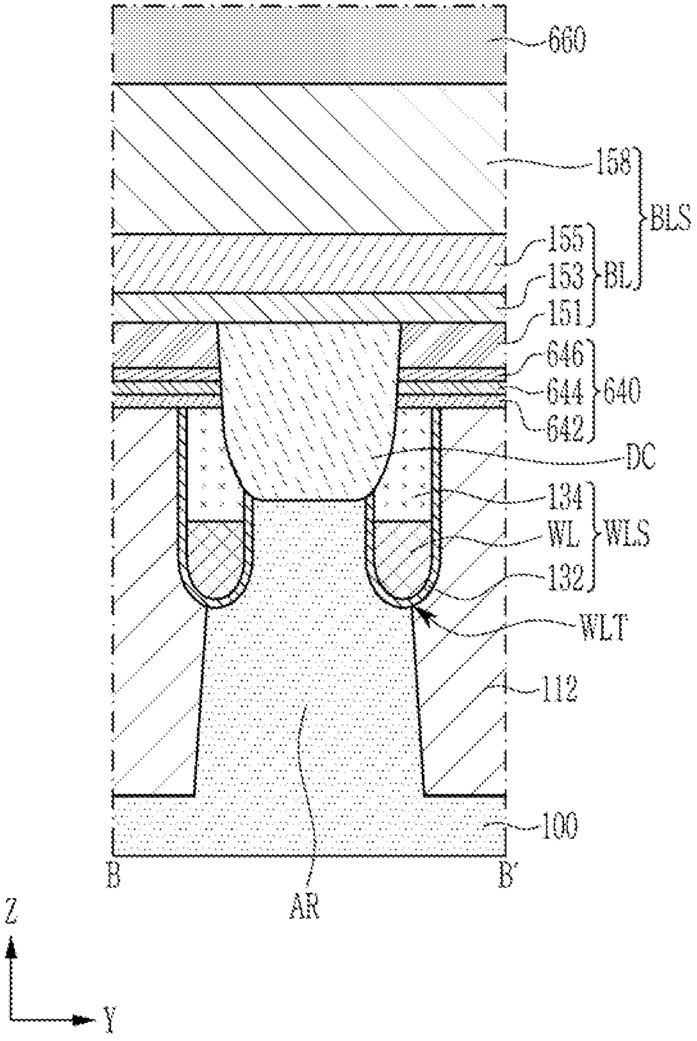
FIG. 3 is a cross-sectional view of FIG. 1, taken along the line B-B'.

As shown in FIG. 1 to FIG. 3, a semiconductor device, according to an embodiment, includes an active region AR, and a word line WL and a bit line BL that cross each other while overlapping the active region AR.

The active region AR may be defined by an element isolation layer 112 disposed within a substrate 100. A plurality of active regions AR may be disposed within the substrate 100, and the plurality of active regions AR are separated from each other by the element isolation layer 112. The element isolation layer 112 may be disposed on both sides of each active region AR.

The substrate 100 may include a semiconductor material. For example, the substrate 100 may include a group IV semiconductor, a group III-V compound semiconductor, a group II-VI compound semiconductor, and the like. For example, the substrate 100 may include a semiconductor such as Si or Ge, or a compound semiconductor such as SiGe, SiC, GaAs, InAs, or InP. However, the material of the substrate 100 is not necessarily limited thereto and may be variously changed. The substrate 100 may have a top surface parallel to a first direction (X-axis direction) and a second direction (Y-axis direction), and a thickness parallel to a third direction (Z-axis direction) that is perpendicular to the first direction X-axis direction) and the second direction (Y-axis direction).

The active region AR may have a bar shape extending along a fourth direction DR4 that is oblique to the first direction X and the second direction Y. The fourth direction DR4 is parallel to the top surface of the substrate 100 and may be disposed on the same plane as the first direction X and the second direction Y. The fourth direction DR4 may form an acute angle with the first direction X and the second direction Y. The plurality of active regions AR may extend in directions parallel to each other. The plurality of active regions AR may be spaced apart by a predetermined interval along the fourth direction DR4 and the first direction X. A center of one active region AR may be adjacent to an end of another active region AR in the first direction X. One end of one active region AR may be adjacent to the other end of another active region AR in the first direction X. However, the shape or disposition form of the active region AR is not necessarily limited thereto and may be variously changed.

The substrate 100 may include a cell array region and a peripheral circuit region. The cell array region is a region in which a plurality of memory cells are formed, and the plurality of active regions AR may be disposed in the cell array region. The peripheral circuit region may surround a cell array region, and elements driving memory cells may be disposed therein. FIG. 1 to FIG. 3 illustrate the cell array region for convenience, and the illustration of the peripheral circuit region is omitted.

The element isolation layer 112 may have a shallow trench isolation (STI) structure having excellent element isolation characteristics. The element isolation layer 112 may be formed of a silicon oxide, a silicon nitride, or a combination thereof. However, the material of the element isolation layer 112 is not necessarily limited thereto and may be variously changed. The element isolation layer 112 may be formed of a single layer or multiple layers. The element isolation layer 112 may be formed of a single material or may include two or more insulating materials.

The word line WL may extend along the first direction X and may intersect the active region AR. The word line WL may overlap the active region AR and may serve as a gate electrode. One word line WL may overlap with a plurality of adjacent active regions ARs along the first direction X. The semiconductor device according to an embodiment may include a plurality of word lines WL. The plurality of word lines WL may extend in parallel along the first direction X and may be spaced apart from each other at regular intervals along the second direction Y.

Each of the plurality of active regions AR may cross and overlap two word lines WL. Each active region AR may be divided into three parts by two word lines WL. In this case, a center of the active region AR disposed between the two word lines WL may be a part connected to the bit line BL, and both ends of the active region AR disposed outside the two word lines WL may be a portion connected to a capacitor. The bit line BL can be connected to the active region AR through direct contact DC. The direct contact DC may be an element that provides a direct electrically connection between two elements, such as the bit line BL and the active region AR, as mentioned above. The direct contact DC may be formed from an electrically conductive line, trace, wire, etc. The capacitor may be connected to the active region AR through a landing pad LP and a buried contact BC.

A word line trench WLT may be formed on the substrate 100, and a word line structure WLS may be disposed within the word line trench WLT. For example, the word line structure WLS may have a filled form within the substrate 100. A portion of the word line trench WLT may be disposed on the active region AR, and another portion may be disposed on the element isolation layer 112. The word line structure WLS may include a gate insulation layer 132, a word line WL disposed on the gate insulation layer 132, and a word capping layer 134 disposed on the word line WL. However, the position, shape, structure, and the like of the word line structure WLS are not necessarily limited thereto and may be variously changed.

The gate insulation layer 132 may be disposed within the word line trench WLT. The gate insulation layer 132 may be conformally formed on an inner wall surface of the word line trench WLT. The gate insulation layer 132 may include a silicon oxide, a silicon nitride, a silicon oxynitride, a high dielectric constant (high-k) material having a higher dielectric constant than the silicon oxide, or a combination thereof.

However, the position, shape, the material, and the like of the gate insulation layer 132 are not necessarily limited thereto and may be variously changed.

The word line WL may be disposed above the gate insulation layer 132. Side and bottom surfaces of the word line WL may be surrounded by the gate insulation layer 132. The gate insulation layer 132 is disposed between the word line WL and the active region AR. Therefore, the word line WL might not directly contact the active region AR. The word line WL may include Ti, TiN, Ta, TaN, W, WN, TiSiN, WSiN, polysilicon, or a combination thereof. However, the position, the shape, the material, and the like of the word line WL are not necessarily limited thereto and may be variously changed.

The word capping layer 134 may be disposed on the word line WL. The word capping layer 134 may entirely cover an upper surface of the word line WL. A bottom surface of the word capping layer 134 may contact the word line WL. A side surface of the word capping layer 134 may be covered by a gate insulation layer 132. The word capping layer 134 may include a silicon oxide, a silicon nitride, a silicon oxynitride, or a combination thereof. However, the position, the shape, the material, and the like of the word capping layer 134 are not necessarily limited thereto and may be variously changed.

The word line WL may be disposed on both sides of the direct contact DC, and the word line WL and the direct contact DC may overlap in the third direction Z. The upper surface of the word line WL may be disposed at a lower level than a bottom surface of the direct contact DC. A word capping layer 134 may be disposed between the word line WL and the direct contact DC. Therefore, the word capping layer 134 may insulate between the word line WL and the direct contact DC. However, the position relationship between the word line WL and the direct contact DC is not necessarily limited thereto and may be variously changed.

The bit line BL may extend along the second direction Y and may intersect the active region AR and the word line WL. In this case, the bit line BL may cross the word line WL vertically. The bit line BL may be disposed on the word line WL. One bit line BL may overlap with a plurality adjacent of active regions AR along the second direction Y. The bit line BL may be connected to the active region AR through the direct contact DC. One bit line BL may be connected with a plurality adjacent of active regions AR along the second direction Y. Each of the plurality of active regions AR may be connected to one bit line BL. A center portion of the active region AR may be connected to the bit line BL. However, this is just one example, and the connection form of the bit line BL and the active region AR may be changed in various ways. The semiconductor device according to an embodiment may include a plurality of bit lines BL. The plurality of bit lines BL may extend in parallel along the second direction Y and may be spaced apart from each other at regular intervals along the first direction X.

A direct contact trench DCT may be formed on the substrate 100, and the direct contact DC may be disposed within the direct contact trench DCT. The direct contact trench DCT may be disposed on the active region AR, and the direct contact DC may be connected to the active region AR. A direct contact DC may be directly connected to the active region AR. The direct contact DC may overlap the active region AR and the third direction Z. The direct contact DC may include a conductive material. For example, the direct contact DC may include an impurity-doped polysilicon or a metal such as W, Mo, Au, Cu, Al, Ni, Co, and the like.

The bit line BL may be disposed on the substrate 100 and the direct contact DC. The bit line BL may include a first conductive layer 151, a second conductive layer 153, and a third conductive layer 155 that are sequentially accumulated. The first conductive layer 151, the second conductive layer 153, and the third conductive layer 155 may include a conductive material. For example, the first conductive layer 151 may include an impurity-doped polysilicon or a metal such as W, Mo, Au, Cu, Al, Ni, Co, and the like. The second conductive layer 153 may include a metal such as Ti or Ta and/or a metal nitride such as TiN or TaN. The third conductive layer 155 may include a metal such as W, Mo, Au, Cu, Al, Ni, or Co. However, the structure and material of the conductive layers constituting the bit line BL are not necessarily limited thereto and may be variously changed.

The bit line BL may be in direct contact with the direct contact DC. The first conductive layer 151 of the bit line BL may come into contact with the side surface of the direct contact DC, and the second conductive layer 153 of the bit line BL may come into contact with the top surface of the direct contact DC. The direct contact DC is disposed between the active region AR and the bit line BL, and may electrically connect between the active region AR and the bit line BL. For example, the bit line BL may be connected to the active region AR through the direct contact DC. Among the conductive layers constituting the bit line BL, the first conductive layer 151 and the direct contact DC may include the same material. For example, the first conductive layer 151 and the direct contact DC may include polysilicon doped with an impurity. However, it is not necessarily limited thereto, and the first conductive layer 151 and the direct contact DC may include different materials.

A bit line capping layer 158 may be disposed on the bit line BL. The bit line BL and the bit line capping layer 158 may form a bit line structure BLS. The bit line capping layer 158 may overlap the bit line BL and the direct contact DC in the third direction Z. The bit line BL and the direct contact DC may be patterned using the bit line capping layer 158 as a mask. A planar shape of the bit line BL may be substantially the same as the bit line capping layer 158. The bit line capping layer 158 is shown as being in contact with the third conductive layer 155 of the bit line BL, but is not necessarily limited thereto. Another layer may be further disposed between the bit line capping layer 158 and the third conductive layer 155 of the bit line BL. The bit line capping layer 158 may include a silicon nitride. However, the material of the bit line capping layer 158 is not necessarily limited thereto and may be variously changed.

A spacer structure 620 may be disposed on both sides of the bit line structure BLS. The spacer structure 620 may cover the side of the bit line capping layer 158, the bit line BL, and the direct contact DC. The spacer structure 620 may extend approximately in the third direction Z along the side of the bit line structure BLS. At least a part of the spacer structure 620 may be disposed within the direct contact trench DCT. Within the direct contact trench DCT, the spacer structure 620 may be disposed on both sides of the direct contact DC.

The spacer structure 620 may be formed of multiple layers formed of a combination of various types of insulating materials. The spacer structure 620 may include a first spacer 622, a second spacer 624, a third spacer 626, and a fourth spacer 628. However, it is not necessarily limited thereto, and the number and structure of layers constituting the spacer structure 620 may be variously changed. The spacer structure 620 may be formed of a single layer. In some cases, the spacer structure 620 may be formed of an air spacer structure surrounded by spacers and having an air space.

The first spacer 622 may cover the side of the bit line structure BLS and the direct contact DC. In the direct contact trench DCT, the first spacer 622 may cover the bottom and side surfaces of the direct contact trench DCT.

The second spacer 624 may be disposed above the first spacer 622. The bottom and side surfaces of the second spacer 624 may be surrounded by the first spacer 622. The second spacer 624 may be disposed within the direct contact trench DCT. The second spacer 624 may fill the direct contact trench DCT. The second spacer 624 may be positioned on both sides of the direct contact DC in the direct contact trench DCT.

The third spacer 626 may be disposed above the first spacer 622 and the second spacer 624. The third spacer 626 may overlap the first spacer 622 along the first direction X, and may overlap the second spacer 624 along the third direction Z. The third spacer 626 may extend approximately in the third direction Z along the side of the first spacer 622. The third spacer 626 may be extended parallel to the first spacer 622. A bottom surface and a side surface of the third spacer 626 may be surrounded by a first spacer 622, a second spacer 624, and a fourth spacer 628.

The fourth spacer 628 may be disposed above the second spacer 624 and the third spacer 626. The fourth spacer 628 may overlap the second spacer 624 along the third direction Z, and may overlap the third spacer 626 along the first direction X. The fourth spacer 628 may extend approximately in the third direction Z along the side of the third spacer 626. The fourth spacer 628 may extend parallel to the first spacer 622 and the third spacer 626. A bottom surface and a side surface of the fourth spacer 628 may be surrounded by the second spacer 624 and the third spacer 626.

The spacer structure 620 may include an insulating material. Each of the first spacer 622, the second spacer 624, the third spacer 626, and the fourth spacer 628 may include the same material. Alternatively, at least some of the first spacer 622, the second spacer 624, the third spacer 626, and the fourth spacer 628 may include different materials. Each of the first spacer 622, the second spacer 624, the third spacer 626, and the fourth spacer 628 may include a silicon nitride, a silicon oxide, a silicon oxynitride, a silicon carbon oxide, a silicon carbonitride, silicon oxycarbonitride, or a combination thereof. For example, the first spacer 622 and the third spacer 626 may include a silicon oxide, and the second spacer 624 and the fourth spacer 628 may include a silicon nitride. However, the material of the spacer structure 620 is not necessarily limited thereto and may be variously changed.

An insulation layer 640 may be disposed below the bit line BL. The insulation layer 640 may be disposed between the bit line BL and the element isolation layer 112. The direct contact DC is disposed between the bit line BL and the active region AR, and the insulation layer 640 might not be disposed therebetween. The insulation layer 640 may be disposed on the word line structure WLS. The insulation layer 640 may be disposed between the word line structure WLS and the bit line BL. The insulation layer 640 may include a first insulation layer 642, a second insulation layer 644, and a third insulation layer 646 that are sequentially accumulated. At least some of the first insulation layer 642, the second insulation layer 644, and the third insulation layer 646 may have different widths. Widths of the second insulation layer 644 and the third insulation layer 646 may be substantially the same. Widths of the second insulation layer 644 and the third insulation layer 646 may be substantially the same as those of the bit line BL and the bit line capping layer 158. A width of the first insulation layer 642 may be different from widths of the second insulation layer 644 and the third insulation layer 646. The width of the first insulation layer 642 may be wider than that of the second insulation layer 644 and the third insulation layer 646. Accordingly, the width of the first insulation layer 642 may be wider than that of the bit line BL.

The insulation layer 640 may be covered by the spacer structure 620. For example, an upper surface of the first insulation layer 642 may be covered by the first spacer 622. Side surfaces of the second insulation layer 644 and the third insulation layer 646 may be covered by the first spacer 622.

The insulation layer 640 may include an electrically insulating material. Each of the first insulation layer 642, the second insulation layer 644, and the third insulation layer 646 may include an electrically insulating material. For example, the first insulation layer 642 may include a silicon oxide. The second insulation layer 644 may include a material having different etch selectivity from that of the first insulation layer 642. For example, the second insulation layer 644 may include a silicon nitride. For example, the third insulation layer 646 may include a silicon oxide or a silicon nitride. However, the structure and material of the insulation layer 640 are not necessarily limited thereto and may be variously changed.

The buried contacts BC may be disposed between the plurality of bit lines BL. The semiconductor device according to an embodiment may include a plurality of buried contacts BC. The plurality of buried contacts BC may be spaced apart from each other along the first direction X and the second direction Y. For example, a plurality of buried contacts BC between two adjacent bit lines BL may be disposed so as to be spaced apart from each other along the second direction Y. In addition, a plurality of buried contact BCs between two adjacent word line WLs may be disposed so as to be spaced apart from each other along the first direction X. However, the disposition form of the plurality of buried contacts BC is not necessarily limited thereto and may be variously changed.

At least some of the buried contact BC may overlap the active region AR in the third direction Z, and other parts may overlap the element isolation layer 112 in the third direction Z. The buried contact BC may be electrically connected to the active region AR. The buried contact BC may directly contact the active region AR. At least a part of the bottom surface and the side surface of the buried contact BC is surrounded by the active region AR. However, it is not necessarily limited thereto, and another layer may be further disposed between the buried contact BC and the active region AR, and the buried contact BC may be connected to the active region AR through another layer.

The buried contact BC may include an electrically conductive material. For example, the buried contact BC may include an impurity doped polysilicon, but is not necessarily limited thereto.

The spacer structure 620 may be disposed on both sides of the buried contact BC. The spacer structure 620 may be disposed between the buried contact BC and the bit line BL. For example, one side of the buried contact BC may come into contact with the fourth spacer 628 and the active region AR, and the other side of buried contact BC may come into contact with the fourth spacer 628 and the second spacer 624. The bottom surface of the buried contact BC may contact the first spacer 622. However, this is just one example, and the positional relationship between the buried contact BC and the spacer structure 620 can be changed in various ways.

An upper surface of the buried contact BC may be disposed at a lower level than the upper surface of the bit line BL, and the bottom surface of the buried contact BC may be disposed at a higher level than the bottom surface of the direct contact DC. However, it is not necessarily limited thereto, and the positional relationship between buried contact BC, the bit line BL, and the direct contact DC may be variously changed.

The landing pad LP may be disposed on the buried contact BC. The semiconductor device according to an embodiment may include a plurality of landing pads LP. The plurality of landing pads LP may be spaced apart from each other along the first direction X and the second direction Y. The plurality of landing pads LP may be disposed in a row along the first direction X. The plurality of landing pads LP may be disposed in a zigzag form along the second direction Y. For example, the plurality of landing pads LP may be alternately disposed to the left and right sides based on the bit line BL. However, the disposition form of the plurality of landing pads LP is not necessarily limited thereto and may be variously changed.

The landing pad LP may cover the upper surface of the buried contact BC and overlap the buried contact BC in the third direction Z. At least a part of the landing pad LP may overlap the spacer structure 620 in the third direction Z, and may overlap the bit line BL in the third direction Z. The upper surface of the landing pad LP may be disposed at a higher level than the upper surface of the bit line capping layer 158. The spacer structure 620 may be disposed on both sides of the landing pad LP. The spacer structure 620 may be disposed between the landing pad LP and the bit line BL, and between the landing pad LP and the bit line capping layer 158. The landing pad LP may be electrically connected to the buried contact BC. The landing pad LP may come into direct contact with the buried contact BC. The landing pad LP may be electrically connected to the active region AR through the buried contact BC.

The landing pad LP may include a metal silicide layer 171, a conductive barrier layer 173, and a conductive layer 175. The metal silicide layer 171 may be disposed on the buried contact BC, the conductive barrier layer 173 may be disposed on the metal silicide layer 171, and the conductive layer 175 may be disposed on the conductive barrier layer 173.

The metal silicide layer 171 may directly contact the buried contact BC. The metal silicide layer 171 may entirely cover the upper surface of the buried contact BC. The upper surface of the buried contact BC may be formed in a concave shape, and the metal silicide layer 171 may have a concave shape along the upper surface of the buried contact BC. The spacer structure 620 may be positioned on both sides of the metal silicide layer 171. For example, the metal silicide layer 171 may contact the fourth spacer 628. The metal silicide layer 171 may include a metal silicide material such as cobalt silicide, nickel silicide, manganese silicide, or the like. However, the shape and the material of the metal silicide layer 171 are not necessarily limited thereto and may be variously changed. In some cases, the metal silicide layer 171 may be omitted.

A conductive barrier layer 173 may be disposed between the metal silicide layer 171 and the conductive layer 175. A bottom surface of the conductive barrier layer 173 may contact the metal silicide layer 171. The spacer structure 620 may be disposed on both sides of the conductive barrier layer 173. For example, the conductive barrier layer 173 may cover upper surfaces of the fourth spacer 628, the third spacer 626, and the first spacer 622. The conductive barrier layer 173 may contact the fourth spacer 628, the third spacer 626, and the first spacer 622. The conductive barrier layer 173 may include Ti, TiN, or a combination thereof. However, the shape and the material of the conductive barrier layer 173 are not necessarily limited thereto and may be variously changed.

The bottom surface of the conductive layer 175 may contact the conductive barrier layer 173. At least a portion of the bottom surface and side surfaces of the conductive layer 175 may be surrounded by the conductive barrier layer 173. The conductive barrier layer 173 may be disposed between the conductive layer 175 and the metal silicide layer 171. The conductive barrier layer 173 may be disposed between the conductive layer 175 and the spacer structure 620. The conductive layer 175 may include a metal, a metal nitride, impurity-doped polysilicon, or a combination thereof. For example, the conductive layer 175 may include W. However, the shape and the material of the conductive layer 175 are not necessarily limited thereto and may be variously changed.

An insulation pattern 660 may be disposed between the plurality of landing pads LP. The insulation pattern 660 may fill a space between a plurality of landing pads LP. The plurality of landing pads LP may be separated from each other by the insulation pattern 660. The landing pad LP may include a silicon nitride, a silicon oxide, a silicon oxynitride, or a combination thereof. The landing pad LP may be formed of a single layer or multiple layers. For example, the landing pad LP may include a first material layer and a second material layer that are stacked. In this case, the first material layer may include a low dielectric constant (low-k) material having a low dielectric constant such as silicon oxide, SiOCH, or SiOC, and the second material layer may include silicon nitride or silicon oxynitride. However, the shape and the material of the landing pad LP are not necessarily limited thereto and can be variously changed.

A capacitor structure may be disposed on the landing pad LP. The capacitor structure may include a first capacitor electrode, a second capacitor electrode, and a dielectric layer disposed between the first capacitor electrode and the second capacitor electrode. The first capacitor electrode may come into contact with the landing pad LP and may be electrically connected to the landing pad LP. The capacitor structure may be electrically connected to the active region AR through the landing pad LP and the buried contact BC. The semiconductor device according to an embodiment may include a plurality of capacitor structures. A first capacitor electrode may be disposed on each landing pad LP, and a plurality of first capacitor electrodes may be separated from each other. The same voltage may be applied to the second capacitor electrode of the plurality of capacitor structures, and may be integrally formed. A dielectric layer of a plurality of capacitor structures may be integrally formed.

In the semiconductor device according to an embodiment, at least some of the constituent elements disposed on both sides with respect to the direct contact DC may have an asymmetrical shape. Hereinafter, referring to FIG. 4 to FIG. 6, a portion having an asymmetric shape in the semiconductor device according to an embodiment will be described. In FIG. 1 to FIG. 3, the degree of asymmetry of each part might not be shown, and may be seen in detail in the enlarged view shown in FIG. 4 to FIG. 6.

Figure 4:
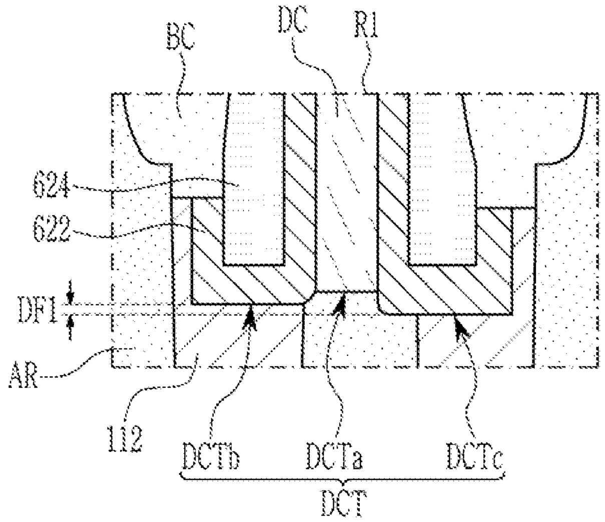
FIG. 4 is an enlarged cross-sectional view of the region R1 of FIG. 2.
Figure 5:
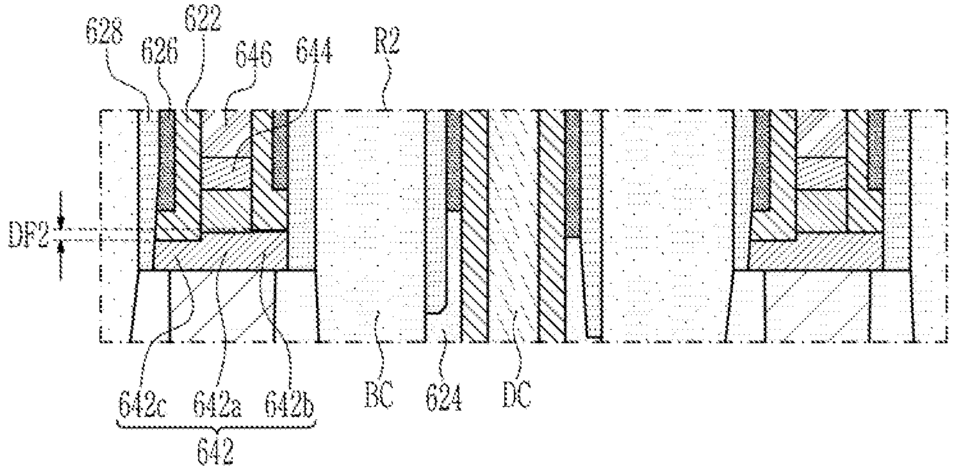
FIG. 5 is an enlarged cross-sectional view of the region R2 of FIG. 2.
Figure 6:
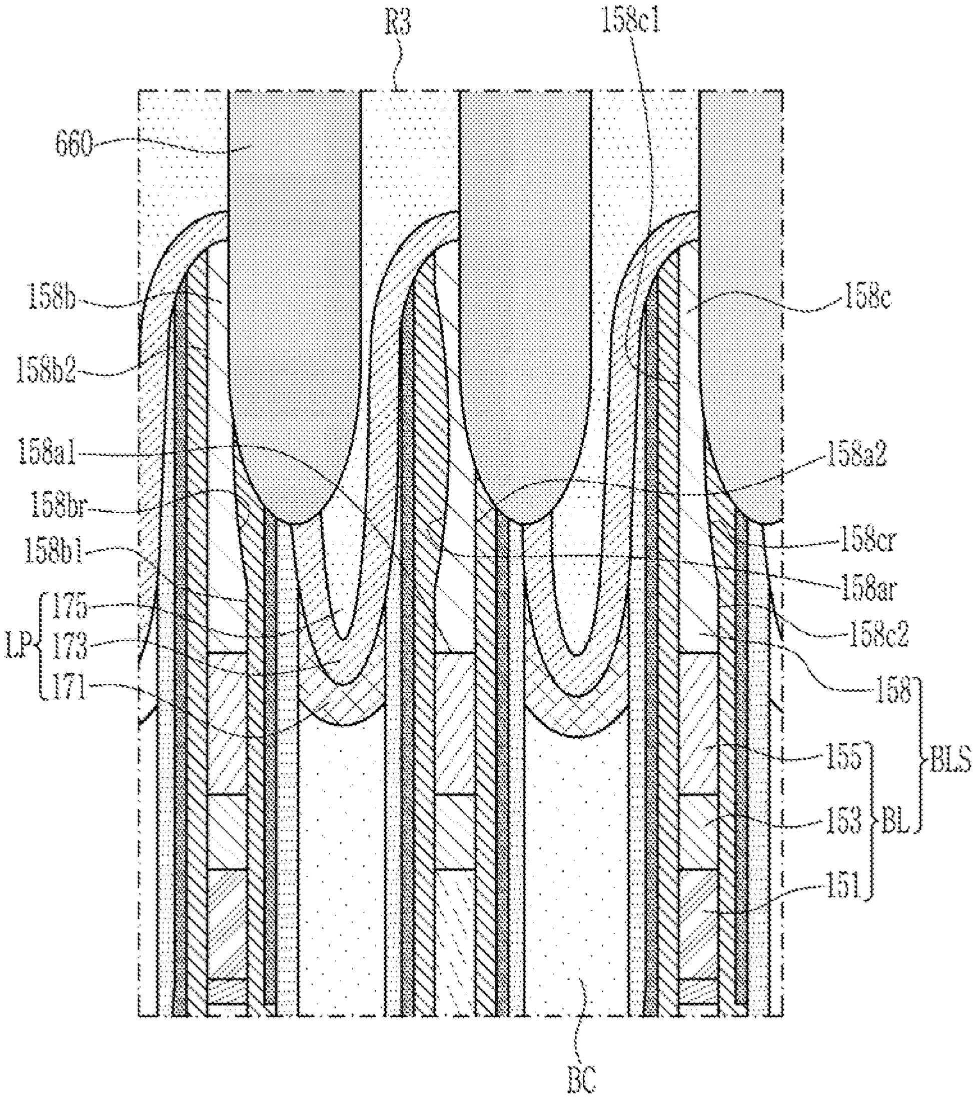
FIG. 6 is an enlarged view of the region R of FIG. 2.

FIG. 4 is an enlarged cross-sectional view of the region R1 of FIG. 2, FIG. 5 is an enlarged cross-sectional view of the region R2 of FIG. 2, and FIG. 6 is an enlarged view of the region R of FIG. 2.

As shown in FIG. 4, a depth of the direct contact trench DCT in the semiconductor device according to an embodiment may change according to location. The direct contact trench DCT may include a first portion DCTa disposed where the direct contact DC is disposed, and a second portion DCTb and a third portion DCTc disposed on both sides of the first portion DCTa.

The first portion DCTa of the direct contact trench DCT may be disposed approximately at a center of the direct contact trench DCT. The first portion DCTa of the direct contact trench DCT may be disposed on the active region AR. The direct contact DC may be disposed within the first portion DCTa of the direct contact trench DCT. The direct contact DC may be connected to the active region AR disposed under the first portion DCTa of the direct contact trench DCT.

The second portion DCTb of the direct contact trench DCT may be disposed on one side of the first portion DCTa. For example, in FIG. 4, the second portion DCTb may be disposed to the left of first portion DCTa. The second portion DCTb of the direct contact trench DCT may be disposed on the element isolation layer 112. The spacer structure 620 may be disposed within the second portion DCTb of the direct contact trench DCT. A first spacer 622 may be disposed on a bottom surface of the second portion DCTb of the direct contact trench DCT. The first spacer 622 may be disposed on a sidewall of the direct contact trench DCT and also on a sidewall of the direct contact DCT. The second spacer 624 may be disposed above the first spacer 622, and at least a part of the second spacer 624 may be surrounded by the first spacer 622.

The third portion DCTc of the direct contact trench DCT may be disposed on the other side of the first portion DCTa. For example, in FIG. 4, the third portion DCTc may be disposed to the right of the first portion DCTa. The third portion DCTc of the direct contact trench DCT may be disposed on the element isolation layer 112. The spacer structure 620 may be disposed within the third portion DCTc of the direct contact trench DCT. The first spacer 622 may be disposed on a bottom surface of the third portion DCTc of the direct contact trench DCT. The first spacer 622 may be disposed on a sidewall of the direct contact trench DCT and also on a sidewall of the direct contact DCT. The second spacer 624 may be disposed above the first spacer 622, and at least a part of the second spacer 624 may be surrounded by the first spacer 622.

Depths of the second portion DCTb and the third portion DCTc of the direct contact trench DCT may be different from each other. A height of the bottom surface of the second portion DCTb of the direct contact trench DCT may be different from a height of the bottom surface of the third portion DCTc of the direct contact trench DCT. For example, the bottom surface of the second portion DCTb of the direct contact trench DCT may be disposed higher than the bottom surface of the third portion DCTc of the direct contact trench DCT. In this case, the height may mean a length along the third direction Z from the bottom surface of the substrate 100 to the bottom surface of each part of the direct contact trench DCT. A height difference DF1 between the bottom surface of the second portion DCTb and the bottom surface of the third portion DCTc of the direct contact trench DCT may be insignificant. Such a height difference DF1 is because the second portion DCTb and the third portion DCTc of the direct contact trench DCT may be etched through different processes. A process of etching a material disposed within the second portion DCTb of the direct contact trench DCT and a process of etching a material disposed within the third portion DCTc of the direct contact trench DCT may have different conditions.

Due to the height difference DF1 between the bottom surface of the second portion DCTb of the direct contact trench DCT and the bottom surface of the third portion DCTc, a height difference between the first spacer 622 disposed on the bottom surface of the second portion DCTb and the first spacer 622 disposed on the bottom surface of the third portion PCTc may occur. The first spacer 622 disposed on the bottom surface of the second portion DCTb of the direct contact trench DCT may be disposed higher than the first spacer 622 disposed on the bottom surface of the third portion DCTc.

The height difference between the bottom surfaces of the second portion DCTb and the third portion DCTc of the direct contact trench DCT and the height difference between the first spacers 622 are not necessarily limited to those described above. For example, contrary to the above description, the bottom surface of the second portion DCTb of the direct contact trench DCT may be disposed lower than the bottom surface of the third portion DCTc of the direct contact trench DCT. The first spacer 622 disposed on the bottom surface of the second portion DCTb of the direct contact trench DCT may be disposed lower than the first spacer 622 disposed on the bottom surface of the third portion DCTc. In some cases, the heights of the bottom surfaces of the second portion DCTb and the third portion DCTc of the direct contact trench DCT may be substantially the same.

As shown in FIG. 5, in the semiconductor device according to an embodiment, a thickness of the first insulation layer 642 may change according to location. The first insulation layer 642 may include a first portion 642*a* overlapping the bit line BL, and a second portion 642*b* and a third portion 642*c* disposed on both sides of the first portion 642*a*.

The first portion 642*a* of the first insulation layer 642 may be disposed approximately at a center of the first insulation layer 642. The first portion 642*a* of the first insulation layer 642 may overlap the second insulation layer 644 and the third insulation layer 646.

The second portion 642*b* of the first insulation layer 642 may be disposed on one side of the first portion 642*a*. For example, in FIG. 5, the second portion 642*b* may be disposed to the right of the first portion 642*a*. The second portion 642*b* of the first insulation layer 642 might not overlap the bit line BL. The second portion 642*b* of the first insulation layer 642 might not overlap the second insulation layer 644 and the third insulation layer 646. The first spacer 622 may be disposed on the second portion 642*b* of the first insulation layer 642. The third spacer 626 may be disposed above the first spacer 622.

The third portion 642*c* of the first insulation layer 642 may be disposed on the other side of the first portion 642*a*. For example, in FIG. 5, the third portion 642*c* may be disposed to the left of the first portion 642*a*. The third portion 642*c* of the first insulation layer 642 might not overlap the bit line BL. The third portion 642*c* of the first insulation layer 642 might not overlap the second insulation layer 644 and the third insulation layer 646. The first spacer 622 may be disposed on the third portion 642*c* of the first insulation layer 642. The third spacer 626 may be disposed above the first spacer 622.

Thicknesses of the second portion 642*b* and the third portion 642*c* of the first insulation layer 642 may be different from each other. For example, the thickness of the second portion 642*b* of the first insulation layer 642 may be thicker than the thickness of the third portion 642*c* of the first insulation layer 642. A thickness difference DF2 between the second portion 642*b* and the third portion 642*c* of the first insulation layer 642 may be similar to the height difference DF1 between the bottom surfaces of the second portion DCTb and the third portion DCTc of the direct contact trench DCT. The thickness difference DF2 between the thicknesses of the second portion 642*b* and the third portion 642*c* of the first insulation layer 642 may be insignificant.

A difference in height between the first spacer 622 disposed on the second portion 642*b* and the first spacer 622 disposed on the third portion 642*c* may occur due to the thickness difference DF2 between the second portion 642*b* and the third portion 642*c* of the first insulation layer 642. The first spacer 622 disposed on the second portion 642*b* of the first insulation layer 642 may be disposed higher than the first spacer 622 disposed on the third portion 642*c*.

The difference in thickness between the second portion 642*b* and the third portion 642*c* of the first insulation layer 642 and the difference in height between the first spacers 622 are not necessarily limited to those described above. For example, contrary to the above description, the thickness of the second portion 642*b* of the first insulation layer 642 may be thinner than the thickness of the third portion 642*c* of the first insulation layer 642. The first spacer 622 disposed above the second portion 642*b* of the first insulation layer 642 may be disposed lower than the first spacer 622 disposed above the third portion 642*c*. In some cases, the second portion 642*b* and the third portion 642*c* of the first insulation layer 642 may have substantially the same thickness.

As shown in FIG. 6, in the semiconductor device according to an embodiment, both sides of the bit line capping layer 158 may have asymmetrical shapes. One side of both sides of the bit line capping layer 158 may have a concave shape, and the other side may have a flat shape. The bit line capping layer 158 may include a first cap 158*a* overlapping the direct contact DC, a second cap 158*b* and a third cap 158*c* positioned on both sides of the first capping part 158*a*.

The first cap 158*a* of the bit line capping layer 158 may overlap the bit line BL and the direct contact DC. The first cap 158*a* may include a first side surface 158*a*1 and a second side surface 158*a*2 facing each other. The first side surface 158*a*1 of the first cap 158*a* may face the second cap 158*b*, and a concave recessed portion 158*ar* may be formed on the first side surface 158*a*1. The second side surface 158*a*2 of the first cap 158*a* may face the third cap 158*c* and may have a flat shape.

The second cap 158*b* of the bit line capping layer 158 may overlap the bit line BL and might not overlap the direct contact DC. The second cap 158*b* may include a first side surface 158*b*1 and a second side surface 158*b*2 facing each other. The first side surface 158*b*1 of the second cap 158*b* may face the first side surface 158*a*1 of the first cap 158*a*, and a concave recessed portion 158*br* may be formed on the first side surface 158*b*1 of the second cap 158*b*. The second side surface 158*b*2 of the second cap 158*b* may have a flat shape.

The third cap 158*c* of the bit line capping layer 158 may overlap the bit line BL and might not overlap the direct contact DC. The third cap 158*c* may include a first side surface 158*c*1 and a second side surface 158*c*2 facing each other. The first side surface 158*c*1 of the third cap 158*c* may face the second side surface 158*a*2 of the first cap 158*a* and may have a flat shape. A concave portion 158*cr* may be formed on the second side surface 158*c*2 of the third cap 158*c*.

The recessed portions 158*ar* and 158*br* are formed on the first side surface 158*a*1 of the first cap 158*a* and the first side surface 158*b*1 of the second cap 158*b* facing each other. The second side surface 158*a*2 of the first cap 158*a* and the first side surface 158*c*1 of the third cap 158*c* facing each other may each have a flat shape. The two opposite sides of the bit line capping layer 158 positioned on one side based on direct contact DC may have a concave shape, and the two opposite sides of the bit line capping layer 158 positioned on the other side may have a flat shape. However, it is not necessarily limited thereto, and may be made opposite to that described above. For example, two opposite sides of the bit line capping layer 158 positioned on one side based on the direct contact DC may have a flat shape, and two opposite sides of the bit line capping layer 158 positioned on the other side may have a flat shape. In some cases, both sides of all bit line capping layers 158 may have a flat shape.

Hereinafter, referring to FIG. 7 to FIG. 28, a method of manufacturing a semiconductor device according to an embodiment will be described.

Figure 19:
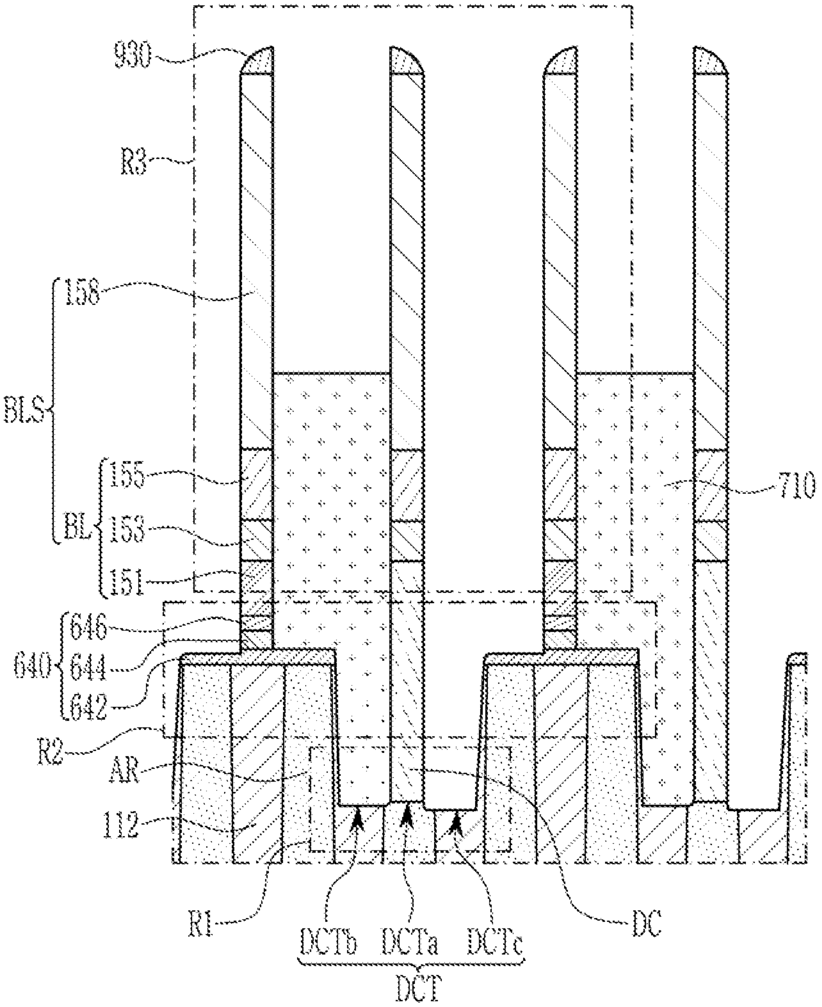
Figure 20A:
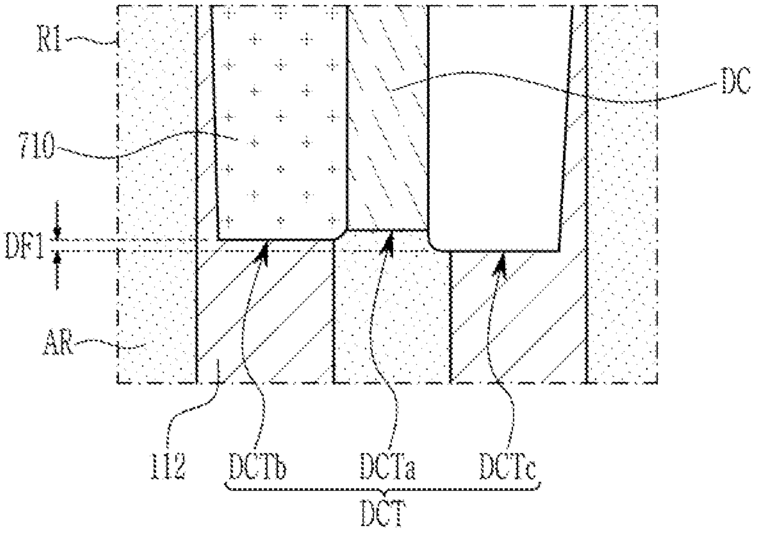
FIG. 20A is an enlarged view of the region R1 of FIG. 19.
Figure 20B:
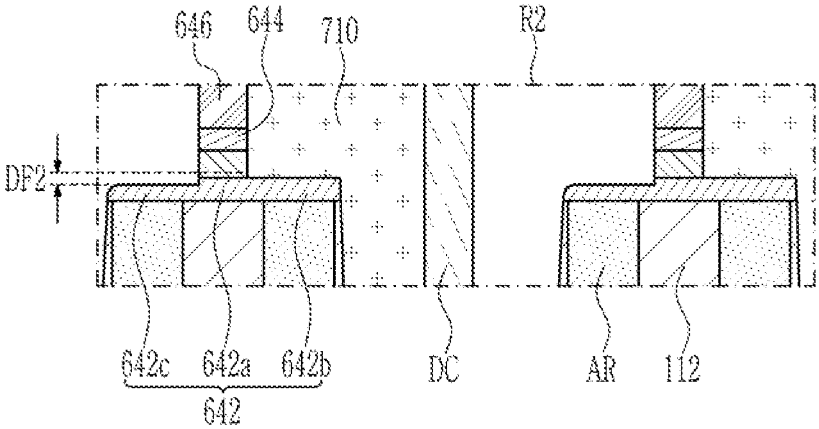
FIG. 20B is an enlarged view of the region R2 of FIG. 19.
Figure 20C:
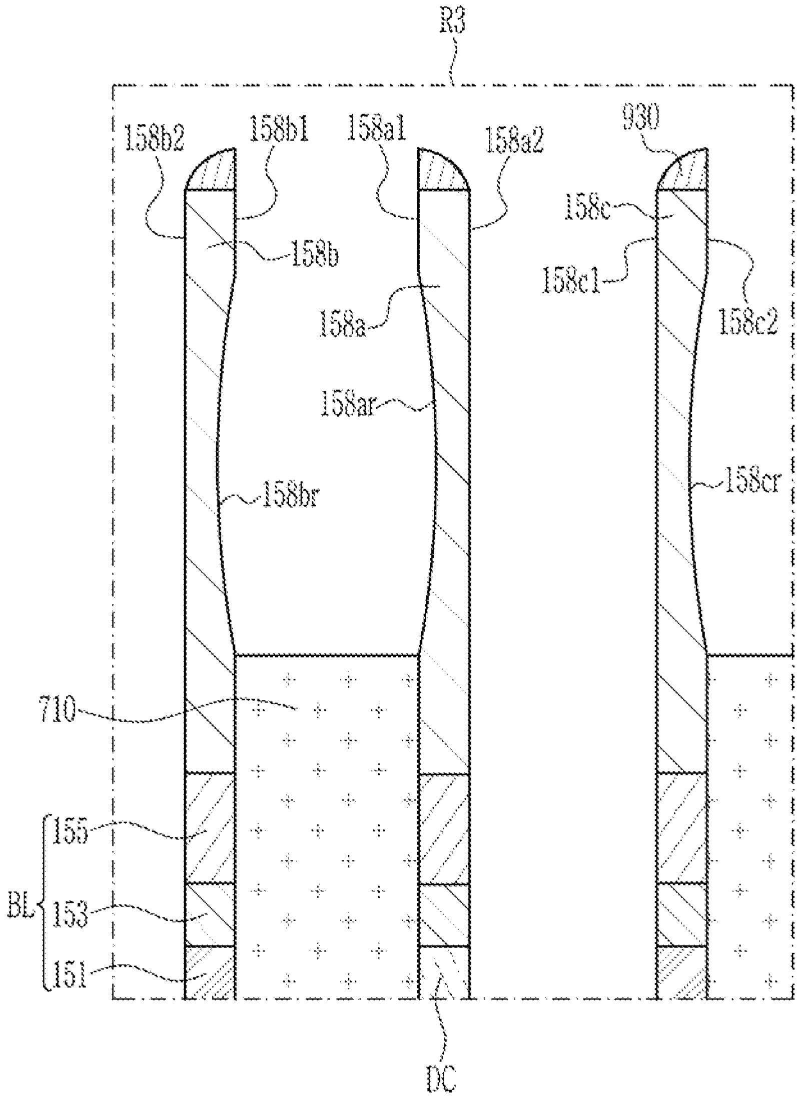
FIG. 20C is an enlarged view of the region R3 of FIG. 19.

FIG. 7 to FIG. 19 and FIG. 21 to FIG. 28 are process cross-sectional views that sequentially show a manufacturing method of a semiconductor device according to an embodiment. FIG. 20A is an enlarged view of the region R1 of FIG. 19, FIG. 20B is an enlarged view of the region R2 of FIG. 19, and FIG. 20C is an enlarged view of the region R3 of FIG. 19.

Figure 7:
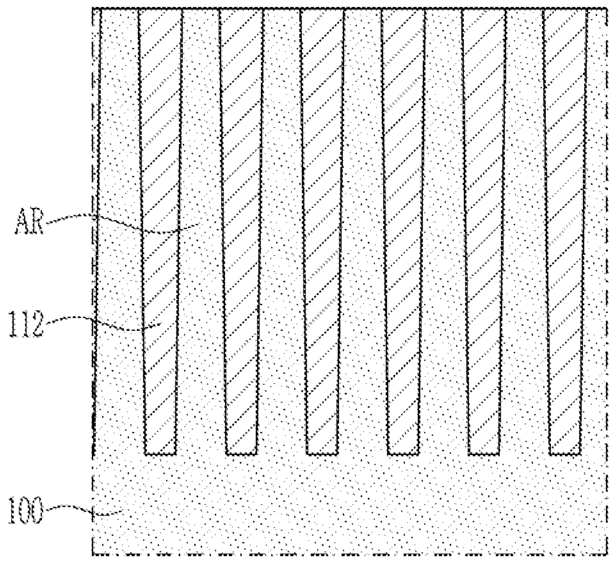
FIG. 7 to FIG. 19 and FIG. 21 to FIG. 28 are process cross-sectional views that sequentially show a manufacturing method of a semiconductor device according to an embodiment of the present disclosure.

As shown in FIG. 7, a trench is formed to isolate a plurality of elements on a substrate 100, and element isolation layers 112 may fill inside the trench. A plurality of active region ARs may be defined by the element isolation layers 112. The plurality of active region ARs may be disposed within the substrate 100, and the plurality of active region ARs may be separated from each other by the element isolation layers 112. The element isolation layers 112 are positioned on both sides of each active region AR. The active region AR may have a bar shape extending along a fourth direction DR4 that is oblique to a first direction X and a second direction Y on a plane.

Figure 8:
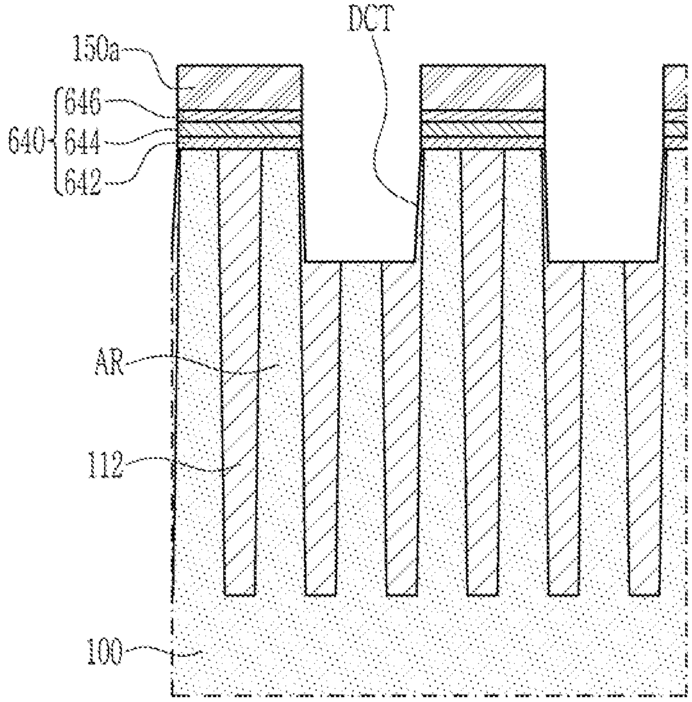

As shown in FIG. 8, a first insulation layer 642, a second insulation layer 644, a third insulation layer 646, and a first material layer 150*a* are sequentially accumulated on the substrate 100, and then patterned to form a direct contact trench DCT.

The first insulation layer 642, the second insulation layer 644, and the third insulation layer 646 may form an insulation layer 640. However, the structure of the insulation layer 640 is not necessarily limited thereto, and may be made of a single layer, a bilayer, or four or more insulation layers. The first insulation layer 642, the second insulation layer 644, and the third insulation layer 646 may each be made of an insulating material. For example, the first insulation layer 642 may include a silicon oxide. The second insulation layer 644 may include a material having different etch selectivity from that of the first insulation layer 642. For example, the second insulation layer 644 may include a silicon nitride. For example, the third insulation layer 646 may include a silicon oxide or a silicon nitride. However, the material of the insulation layer 640 is not necessarily limited thereto and may be variously changed.

The first material layer 150*a* may include a conductive material. For example, the first material layer 150*a* may include impurity-doped polysilicon or a metal such as W, Mo, Au, Cu, Al, Ni, and Co.

The first material layer 150a, the third insulation layer 646, the second insulation layer 644, and the first insulation layer 642 are patterned to form a direct contact trench DCT exposing at least a part of the active region AR. For example, a hard mask layer may be formed on the first material layer 150a. A hard mask pattern may be formed by patterning the hard mask layer using a photo and etching process. The first material layer 150a, the third insulation layer 646, the second insulation layer 644, and the first insulation layer 642 may be sequentially etched using the hard mask pattern. When the first insulation layer 642 is etched, an upper surface of the active region AR and the element isolation layer 112 of the substrate 100 may be exposed. Subsequently, the direct contact trench DCT may be formed by etching the active region AR and the element isolation layer 112. In this case, the active region AR may be disposed approximately at a center of the direct contact trench DCT. The active region AR and the element isolation layer 112 may form a bottom surface of the direct contact trench DCT. The element isolation layer 112, the insulation layer 640, and the first material layer 150a may form a sidewall of the direct contact trench DCT. The direct contact trench DCT may have a shape in which a width gradually narrows toward the bottom surface.

Figure 9:
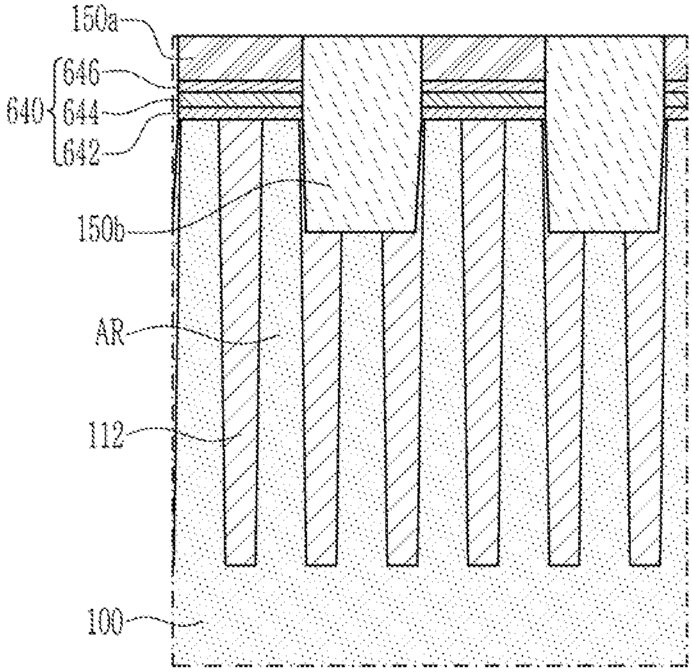

As shown in FIG. 9, a second material layer 150b may be formed in the direct contact trench DCT. The bottom surface of the second material layer 150b may contact the active region AR. A side surface of the second material layer 150b may contact the first material layer 150a. An upper surface of the second material layer 150b and an upper surface of the first material layer 150a may be flat. For example, the upper surface of the second material layer 150b and the upper surface of the first material layer 150a may be disposed at the same level.

First, when a conductive material is deposited in a state where the direct contact trench DCT is formed on the substrate 100, the second material layer 150b may be formed on the first material layer 150a. In this case, the second material layer 150b may fill the inside of the direct contact trench DCT. Subsequently, when a planarization process is performed until an upper surface of the first material layer 150a is exposed, the upper surfaces of the first material layer 150a and the second material layer 150b may be planarized.

The second material layer 150b may include a conductive material. For example, the second material layer 150b may include impurity-doped polysilicon or a metal such as W, Mo, Au, Cu, Al, Ni, and Co. The second material layer 150b may be made of the same material as the first material layer 150a. A boundary between the first material layer 150a and the second material layer 150b might not be clear.

Figure 10:
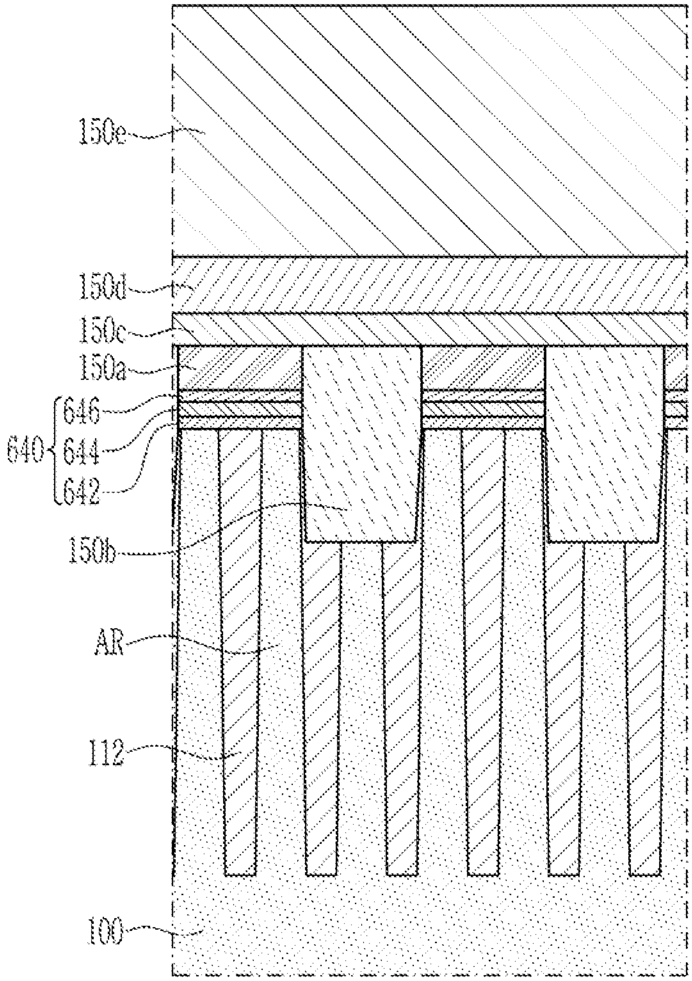

As shown in FIG. 10, a third material layer 150c, a fourth material layer 150d, and a fifth material layer 150e may be sequentially accumulated on the first material layer 150a and the second material layer 150b. A bottom surface of the third material layer 150c may contact the first material layer 150a and the second material layer 150b. The third material layer 150c may be disposed between the first material layer 150a and the fourth material layer 150d, and may be disposed between the second material layer 150b and the fourth material layer 150d. An upper surface of the third material layer 150c may contact the fourth material layer 150d.

The third material layer 150c may include a conductive material. For example, the third material layer 150c may include a metal such as Ti or Ta and/or a metal nitride such as TiN or TaN. The fourth material layer 150d may include an electrically conductive material. For example, the fourth material layer 150d may include a metal such as W, Mo, Au, Cu, Al, Ni, and Co. The fifth material layer 150e may include an electrically insulating material. For example, a silicon nitride may be included. However, the materials of the third material layer 150c, the fourth material layer 150d, and the fifth material layer 150e are not necessarily limited thereto and may be variously changed.

Figure 11:
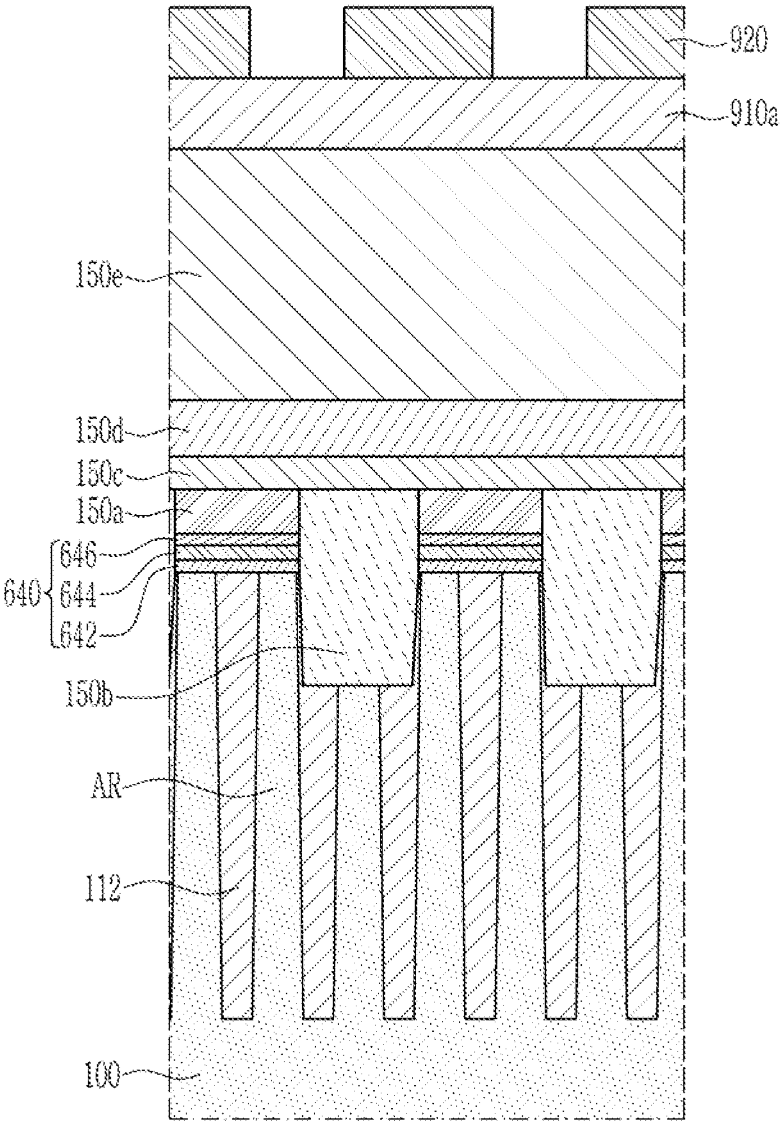

As shown in FIG. 11, a first hard mask layer 910a may be formed on the fifth material layer 150e. A second hard mask layer is formed on the first hard mask layer 910a and patterned to form a second hard mask pattern 920. The second hard mask pattern 920 may include a material that is different from that of the first hard mask layer 910a.

Figure 12:
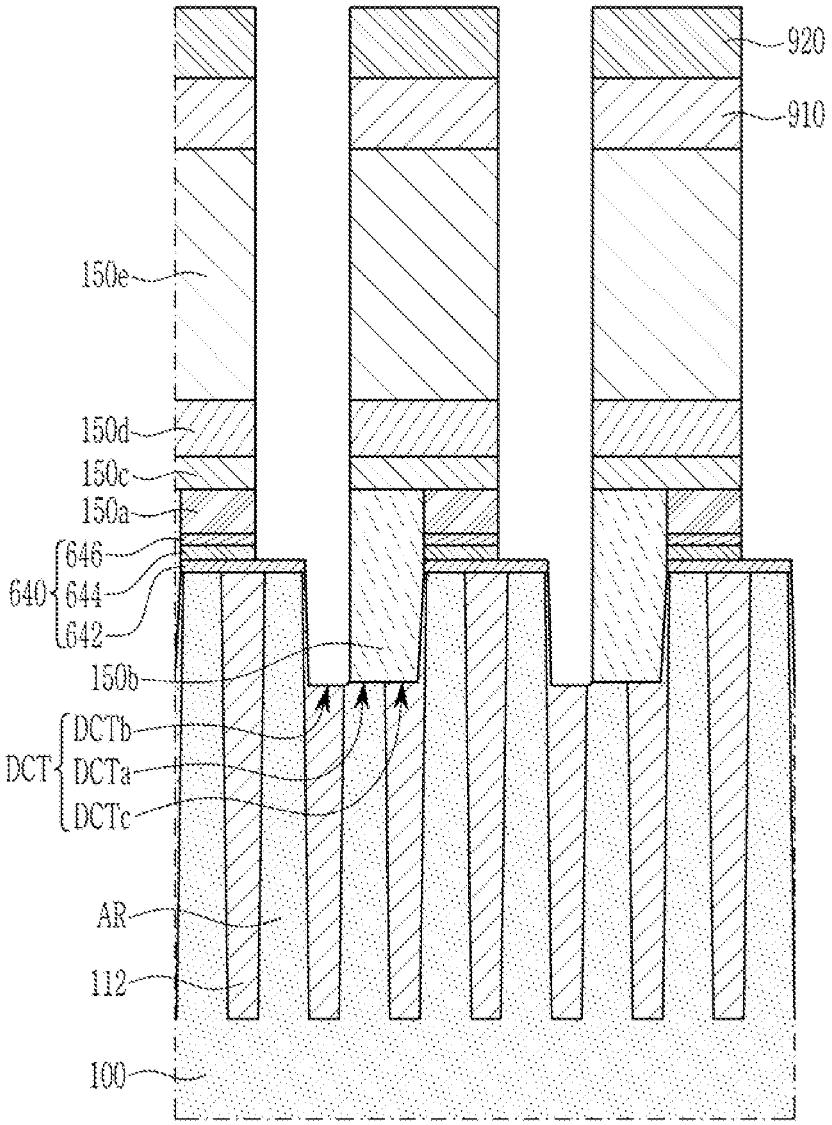

As shown in FIG. 12, the first hard mask pattern 910 may be formed by patterning the first hard mask layer 910a using the second hard mask pattern 920 as a mask. The second hard mask pattern 920 may include an open portion. A portion of the first hard mask layer 910a corresponding to the open portion of the second hard mask pattern 920 may be exposed. The first hard mask pattern 910 may be formed by etching and removing a portion of the exposed first hard mask layer 910a.

Using the first hard mask pattern 910 and the second hard mask pattern 920 as masks, the fifth material layer 150e, the fourth material layer 150d, the third material layer 150c, the second material layer 150b, and the first material layer 150a are patterned (for convenience, referred to as a 'primary patterning process'). The first hard mask pattern 910 may include an open portion, and the fifth material layer 150e, the fourth material layer 150d, the third material layer 150c, the second material layer 150b, and the first material layer 150a corresponding to the open portion of the first hard mask pattern 910 may be sequentially etched. As the first material layer 150a is removed, the second insulation layer 644 and the third insulation layer 646 positioned under the first material layer 150a may be exposed and may be etched. The first insulation layer 642 disposed under the second insulation layer 644 may include a material having different etch selectivity from that of the second insulation layer 644. Accordingly, although the first insulation layer 642 is exposed as the second insulation layer 644 is removed, the first insulation layer 642 may hardly be etched. However, at least a part of the first insulation layer 642 may be etched to reduce the thickness.

The direct contact trench DCT includes a first portion DCTa, and a second portion DCTb and a third portion DCTc disposed on both sides of the first portion DCTa. The first portion DCTa of the direct contact trench DCT may be disposed approximately at a center of the direct contact trench DCT. The first portion DCTa of the direct contact trench DCT may be disposed on the active region DCTa. The second portion DCTb of the direct contact trench DCT may be disposed on one side of the first portion DCTa. For example, in FIG. 12, the second portion DCTb may be disposed to the left of the first portion DCTa. The second portion DCTb of the direct contact trench DCT may be disposed on the element isolation layer 112. The third portion DCTc of the direct contact trench DCT may be disposed on the other side of the first portion DCTa. For example, in FIG. 12, the third portion DCTc may be disposed to the right of the first portion DCTa. A third portion DCTc of the direct contact trench DCT may be disposed on the element isolation layer 112.

The open portion of the first hard mask pattern 910 may overlap the second portion DCTb of the direct contact trench DCT. In the etching process, the second material layer 150b positioned on the second portion DCTb of the direct contact trench DCT may be removed. Accordingly, the bottom surface and sidewall of the second portion DCTb of the direct contact trench DCT may be exposed. The open portion of the first hard mask pattern 910 might not overlap the first portion DCTa and the third portion DCTc of the direct contact trench DCT. The second material layer 150*b* positioned on the first portion DCTa and the third portion DCTc of the direct contact trench DCT may remain without being removed.

Figure 13:
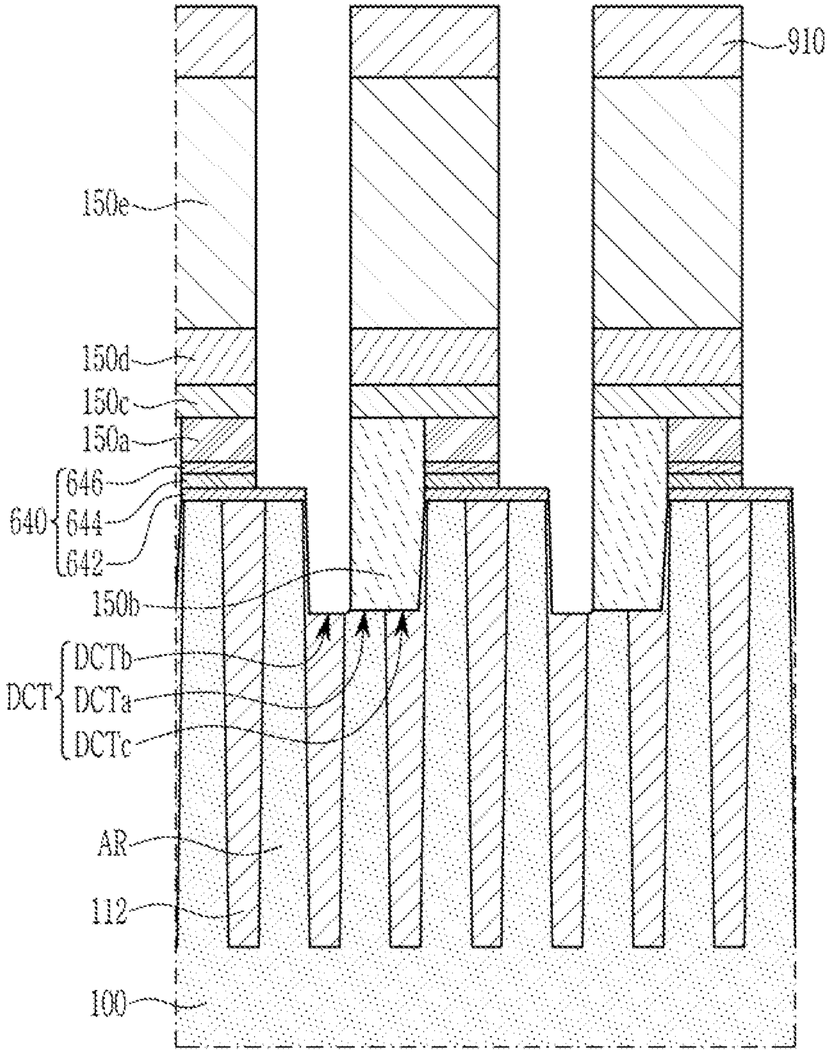

As this etching process proceeds, the second hard mask pattern 920 disposed at the top may be damaged, and at least a part of the second hard mask pattern 920 may be removed. For example, a thickness of the second hard mask pattern 920 may be reduced. The second hard mask pattern 920 may remain on the first hard mask pattern 910 at a certain thickness, and thus the first hard mask pattern 910 can be prevented from being damaged. In addition, damage to the fifth material layer 150*e* disposed under the first hard mask pattern 910 can be prevented. Subsequently, as shown in FIG. 13, the remaining second hard mask pattern 920 may be completely removed by proceeding with an etching process, a strip process, an ashing process, and the like. When the second hard mask pattern 920 is completely removed, the first hard mask pattern 910 may be exposed.

Figure 14:
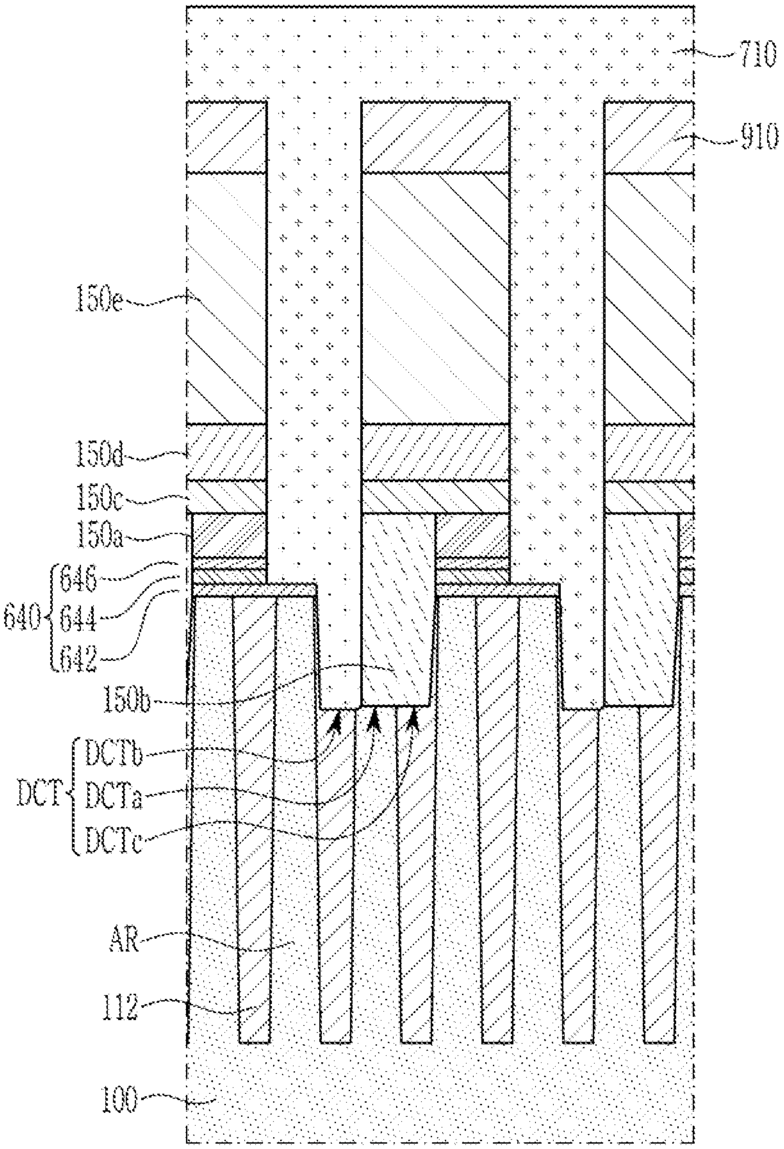

As shown in FIG. 14, a protective layer 710 may be formed on the first hard mask pattern 910. The protective layer 710 may be formed on the first hard mask pattern 910 using an insulating material. The protective layer 710 is formed to fill the open portion of the first hard mask pattern 910 and portions of the fifth material layer 150*e*, the fourth material layer 150*d*, the third material layer 150*c*, the second material layer 150*b*, and the first material layer 150*a* that are removed corresponding to the open portion of the first hard mask pattern 910. A second portion DCTb of the direct contact trench DCT may be filled by the protective layer 710. The protective layer 710 may include a material such as a spin on coating (SOH) or a photoresist. However, the formation method and material of the protective layer 710 are not necessarily limited thereto and may be variously changed.

Figure 15:
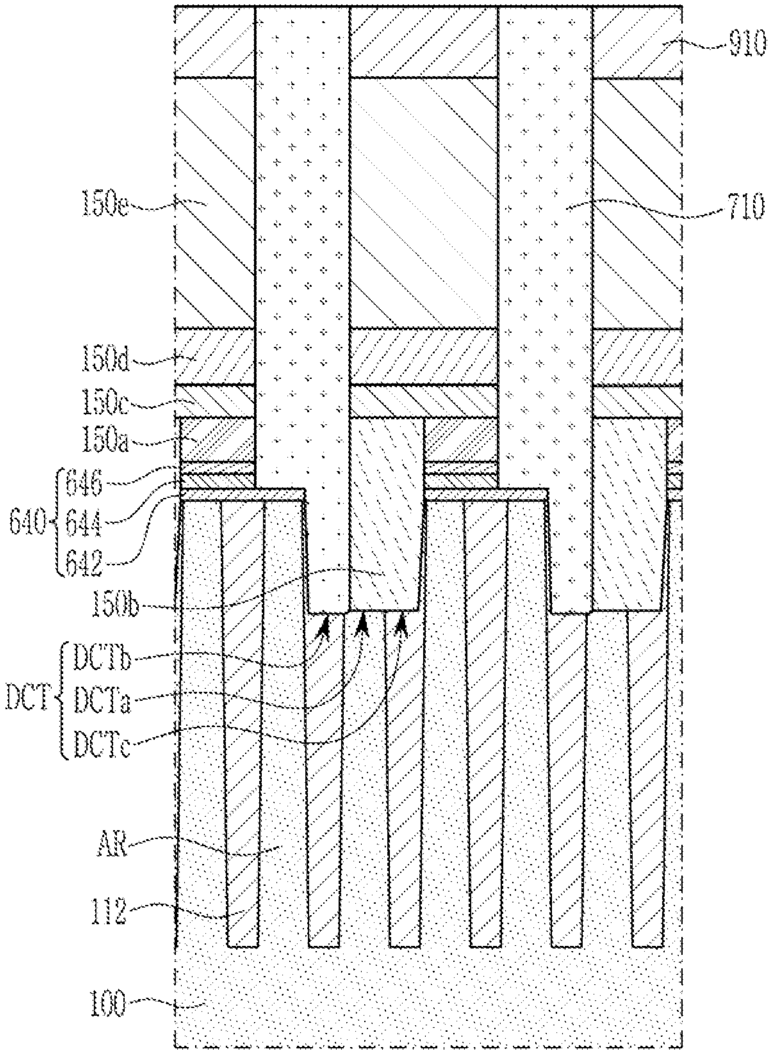

As shown in FIG. 15, at least a part of the protective layer 710 may be removed such that an upper surface of the protective layer 710 is flat with the upper surface of the first hard mask pattern 910. For example, the upper surface of the protective layer 710 and the first hard mask pattern 910 may be planarized by performing an etching process until the upper surface of the first hard mask pattern 910 is exposed. However, it is not necessarily limited thereto, and the planarization process may be performed using a method such as a chemical mechanical polishing process.

Figure 16:
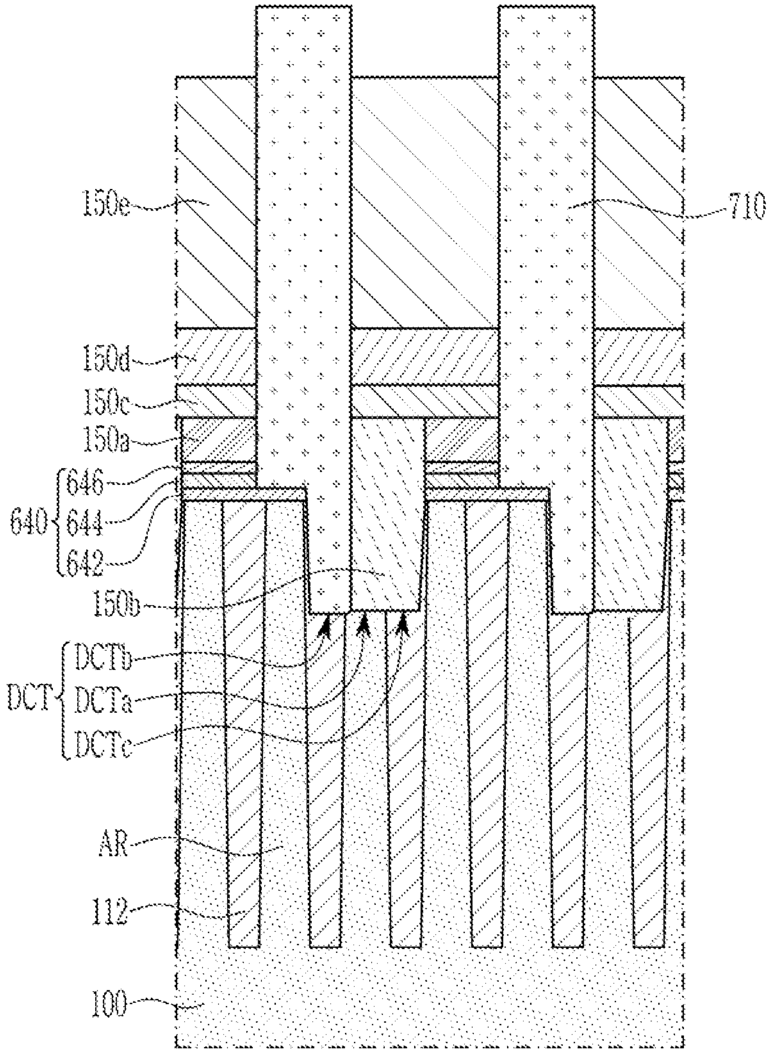

As shown in FIG. 16, the first hard mask pattern 910 is removed. The first hard mask pattern 910 can be removed using a wet etching process or a dry etching process. In this case, the first hard mask pattern 910 can be removed by performing front surface etching without using a separate mask. The first hard mask pattern 910 and the protective layer 710 have different etch selectivities, and even though an etching process is performed, the protective layer 710 may remain without being removed. However, it is not necessarily limited thereto, and the first hard mask pattern 910 may be removed by forming a mask selectively covering the protective layer 710 and then proceeding with an etching process.

As the first hard mask pattern 910 is removed, the fifth material layer 150*e* covered by the first hard mask pattern 910 can be exposed. An upper surface of the fifth material layer 150*e* may be exposed.

Figure 17:
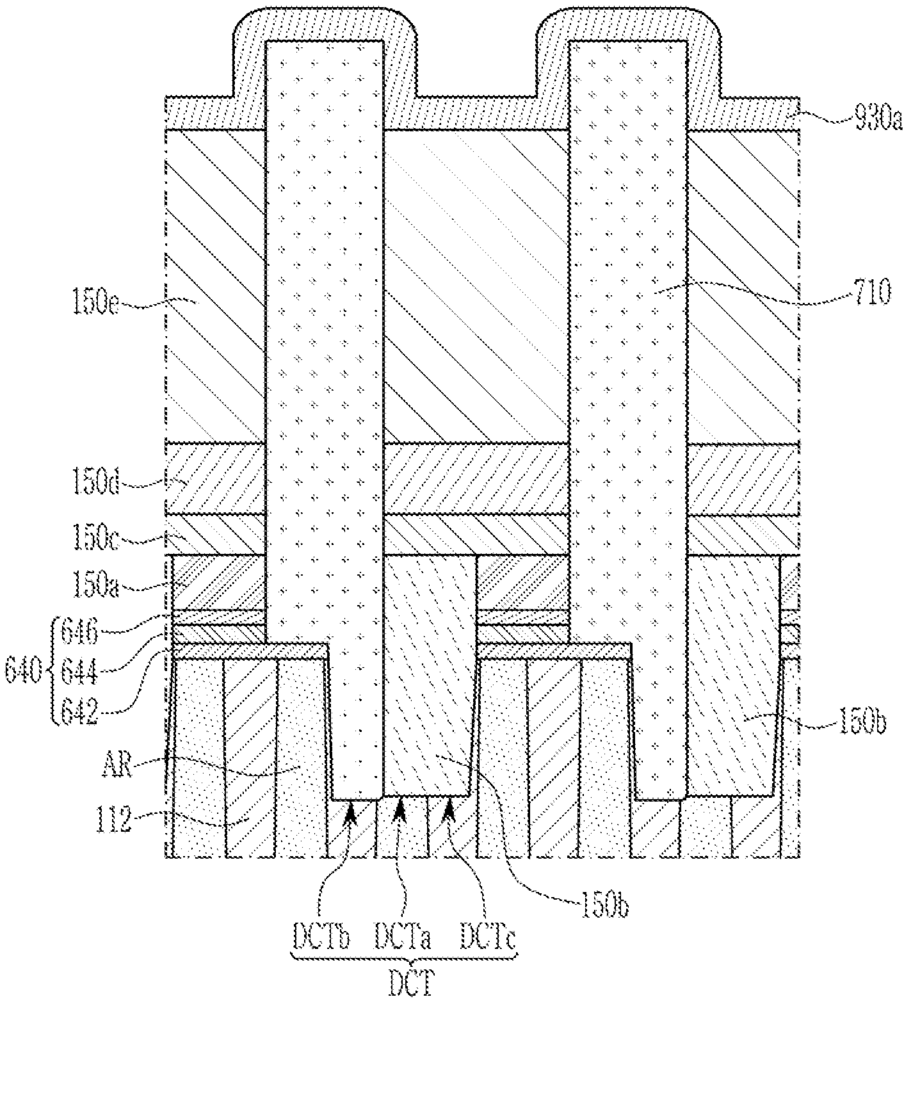

As shown in FIG. 17, a third hard mask layer 930*a* may be formed on the fifth material layer 150*e* and the passivation layer 710. The third hard mask layer 930*a* may be formed using an atomic layer deposition (ALD) method or the like. The third hard mask layer 930*a* may have a conformal shape. The third hard mask layer 930*a* may cover the upper surface of the fifth material layer 150*e* and the upper surface and side surfaces of the protective layer 710. The third hard mask layer 930*a* may include a metal oxide such as an aluminum oxide (AlO). The third hard mask layer 930*a* may be made of other layers subjected to etching in a subsequent process and a material having high etch selectivity. However, the formation method, shape, material, and the like of the third hard mask layer 930*a* are not necessarily limited thereto and may be variously changed.

Figure 18:
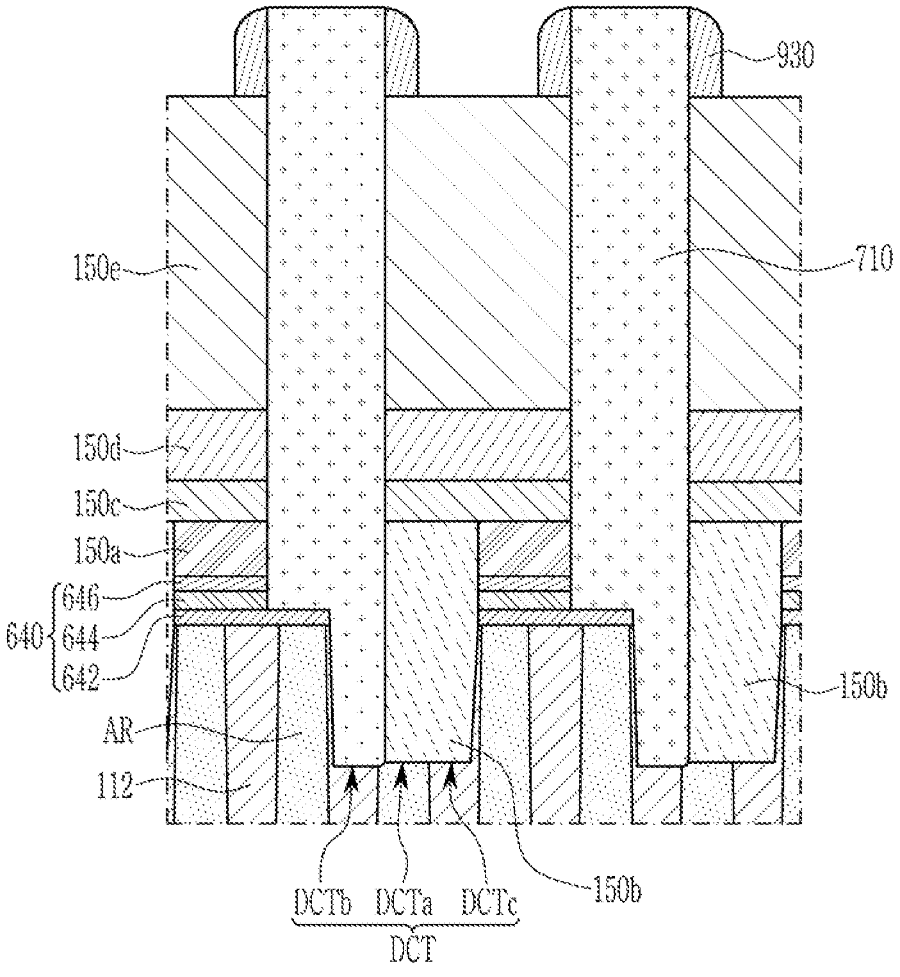

As shown in FIG. 18, the third hard mask pattern 930 may be formed by performing an anisotropic etching process on the third hard mask layer 930*a*. A third hard mask pattern 930 may be positioned on the side surface of the protective layer 710. A portion of the third hard mask layer 930*a* disposed on the upper surface of the protective layer 710 may be removed. Most of the third hard mask layer 930*a* disposed on the upper surface of the fifth material layer 150*e* may be removed. A third hard mask layer 930*a* may remain on the upper surface of the fifth material layer 150*e* adjacent to the passivation layer 710.

As shown in FIG. 19, the fifth material layer 150*e*, the fourth material layer 150*d*, the third material layer 150*c*, the second material layer 150*b*, and the first material layer 150*a* may be patterned using the third hard mask pattern 930 as a mask (hereinafter referred to as a secondary patterning process for convenience). Thus, at least a part of each of the fifth material layer 150*e*, the fourth material layer 150*d*, the third material layer 150*c*, the second material layer 150*b*, and the first material layer 150*a* may be removed. Through such a secondary patterning process, a direct contact DC and a bit line structure BLS can be formed.

The direct contact DC may be formed by patterning the second material layer 150*b*. The direct contact DC may be disposed within the direct contact trench DCT. The direct contact DC may be disposed approximately at a center of the direct contact trench DCT. The direct contact DC may be disposed within a first portion DCTa of the direct contact trench DCT. The direct contact DC may be disposed on an active region AR and connected to the active region AR.

The bit line structure BLS may be formed by patterning the first material layer 150*a*, the third material layer 150*c*, the fourth material layer 150*d*, and the fifth material layer 150*e*. The bit line structure BLS may include a bit line BL and a bit line capping layer 158. The bit line capping layer 158 may be formed by patterning the fifth material layer 150*e*. The bit line BL may include a first conductive layer 151, a second conductive layer 153, and a third conductive layer 155. The first conductive layer 151 of the bit line BL may be formed by patterning the first material layer 150*a*, the second conductive layer 153 of the bit line BL may be formed by patterning the third material layer 150*c*, and the third conductive layer 155 of the bit line BL may be formed by patterning the fourth material layer 150*d*. The second conductive layer 153 may be disposed on the first conductive layer 151 of the bit line BL, the third conductive layer 155 may be disposed on the second conductive layer 153, and the bit line capping layer 158 may be disposed on the third conductive layer 155. In addition, the second conductive layer 153 of the bit line BL may be disposed on the upper surface of the direct contact DC, and the first conductive layer 151 of the bit line BL may be disposed on the side surface of the direct contact DC.

As the second material layer 150*b* disposed within the third portion DCTc of the direct contact trench DCT is removed, the bottom and side surfaces of the direct contact trench DCT may be exposed. As shown in FIG. 20A, depths of the second portion DCTb and the third portion DCTc of the direct contact trench DCT may be different from each other. A height of the bottom surface of the second portion DCTb of the direct contact trench DCT may be different from a height of the bottom surface of the third portion DCTc of the direct contact trench DCT. For example, the bottom surface of the second portion DCTb of the direct contact trench DCT may be disposed higher than the bottom surface of the third portion DCTc of the direct contact trench DCT. However, it is not necessarily limited thereto, and may be made conversely. In this case, the height may mean a length along the third direction Z from the bottom surface of the substrate 100 to the bottom surface of each part of the direct contact trench DCT. A height difference DF1 between the bottom surface of the second portion DCTb and the bottom surface of the third portion DCTc of the direct contact trench DCT may be insignificant.

Such an insignificant height difference DF1 is formed because the second portion DCTb and the third portion DCTc of the direct contact trench DCT are etched through different processes. A material positioned within the second portion DCTb of the direct contact trench DCT may be removed by the primary patterning process as shown in FIG. 12. A material positioned within the third portion DCTc of the direct contact trench DCT may be removed by the secondary patterning process as shown in FIG. 19. In the primary patterning process, the bottom surface of the second portion DCTb of the direct contact trench DCT may be exposed, and in some cases, a portion of the bottom surface of the second portion DCTb may be etched to lower the height of the bottom surface. In the secondary patterning process, the bottom surface of the third portion DCTc of the direct contact trench DCT may be exposed, and in some cases, a portion of the bottom surface of the third portion DCTc may be etched to lower the height of the bottom surface. After the primary patterning process is performed, the condition of the secondary patterning process can be determined in consideration of process errors. In this case, etching conditions of the primary patterning process and the secondary patterning process may be different from each other. Accordingly, the height difference DF1 between the bottom surface of the second portion DCTb and the bottom surface of the third portion DCTc of the direct contact trench DCT occurs.

As the second material layer 150*b* is removed, the second insulation layer 644 and the third insulation layer 646 positioned under the second material layer 150*b* may be exposed and may be etched. The first insulation layer 642 positioned under the second insulation layer 644 may include a material having different etch selectivity from that of the second insulation layer 644. Accordingly, although the first insulation layer 642 is exposed as the second insulation layer 644 is removed, the first insulation layer 642 may hardly be etched. However, at least a part of the first insulation layer 642 may be etched to reduce the thickness.

As shown in FIG. 20B, the first insulation layer 642 may include a second portion 642*b* and a third portion 642*c* positioned on both sides of the first portion 642*a* and the first portion 642*a* overlapping the bit line BL. Thicknesses of the second portion 642*b* and the third portion 642*c* of the first insulation layer 642 may be different from each other. For example, the thickness of the second portion 642*b* of the first insulation layer 642 may be thicker than the thickness of the third portion 642*c* of the first insulation layer 642. However, it is not necessarily limited thereto, and may be made conversely. A thickness difference DF2 between the second portion 642*b* and the third portion 642*c* of the first insulation layer 642 may be similar to the height difference DF1 between the bottom surface of the second portion DCTb and the third portion DCTc of the direct contact trench DCT. The thickness difference DF2 between the thicknesses of the second portion 642*b* and the third portion 642*c* of the first insulation layer 642 may be insignificant.

Such an insignificant difference in thickness DF2 may be formed because the second portion 642*b* and the third portion 642*c* of the first insulation layer 642 may be etched through different processes. A material positioned over the second portion 642*b* of the first insulation layer 642 may be removed by the primary patterning process as shown in FIG. 12. A material positioned over the third portion 642*c* of the first insulation layer 642 may be removed by the secondary patterning process as shown in FIG. 19. In the primary patterning process, the upper surface of the second portion 642*b* of the first insulation layer 642 may be exposed, and in some cases, a part of the upper surface of the second portion 642*b* of the first insulation layer 642 is etched such that to a thickness of the second portion 642*b* of the first insulation layer 642 may be reduced. In the secondary patterning process, the upper surface of the third portion 642*c* of the first insulation layer 642 may be exposed, and in some cases, a part of the upper surface of the third portion 642*c* of the first insulation layer 642 is etched such that the thickness of the third portion 642*c* of the first insulation layer 642 may be reduced.

After the primary patterning process is performed, the condition of the secondary patterning process can be determined in consideration of process errors. In this case, etching conditions of the primary patterning process and the secondary patterning process may be different. Accordingly, the thickness difference DF2 between the second portion 642*b* and the third portion 642*c* of the first insulation layer 642 occurs.

During patterning, at least a part of the third hard mask pattern 930 may be removed together. For example, the thickness of the third hard mask pattern 930 may be reduced. However, not all of the third hard mask pattern 930 is removed, and some remains. For example, the thickness of the third hard mask pattern 930 remaining after patterning may be approximately 1/10 or more and 1/2 or less of the original thickness. However, it is not necessarily limited thereto, and the remaining thickness of the third hard mask pattern 930 can be variously changed.

During patterning, at least a portion of the protective layer 710 may be removed together. For example, the thickness of the protective layer 710 may be reduced. However, not all of the protective layer 710 is removed, and a part remains. For example, the upper surface of the protective layer 710 remaining after patterning may be disposed at a lower level than the upper surface of the bit line capping layer 158 and may be disposed at a higher level than the bottom surface of the bit line capping layer 158. However, it is not necessarily limited thereto, and the position of the upper surface of the protective layer 710 may be variously changed.

As at least a portion of the protective layer 710 is removed, a side surface of the bit line capping layer 158 may be exposed. As shown in FIG. 20C, both sides of the bit line capping layer 158 may have asymmetrical shapes. One side of both sides of the bit line capping layer 158 may have a concave shape, and the other side may have a flat shape. The bit line capping layer 158 may include a first cap 158_a_ overlapping the direct contact DC, and a second cap 158_b_ and a third cap 158_c_ positioned on both sides of the first cap 158_a_.

The first cap 158_a_ of the bit line capping layer 158 may overlap the bit line BL and the direct contact DC. The first cap 158_a_ may include a first side surface 158_a_1 and a second side surface 158_a_2 facing each other. The first side 158_a_1 of the first cap 158_a_ may face the second cap 158_b_, and a concave recessed portion 158_ar_ may be formed on the first side 158_a_1. The second side surface 158_a_2 of the first cap 158_a_ may face the third cap 158_c_ and may have a flat shape.

The second cap 158_b_ of the bit line capping layer 158 may overlap the bit line BL and might not overlap the direct contact DC. The second cap 158_b_ may include a first side surface 158_b_1 and a second side surface 158_b_2 facing each other. The first side surface 158_b_1 of the second cap 158_b_ may face the first side surface 158_a_1 of the first cap 158_a_, and a concave recessed portion 158_br_ may be formed on the first side surface 158_b_1 of the second cap 158_b_. The second side surface 158_b_2 of the second cap 158_b_ may have a flat shape.

The third cap 158_c_ of the bit line capping layer 158 may overlap the bit line BL and might not overlap the direct contact DC. The third cap 158_c_ may include a first side surface 158_c_1 and a second side surface 158_c_2 facing each other. The first side surface 158_c_1 of the third cap 158_c_ may face the second side surface 158_a_2 of the first cap 158_a_ and may have a flat shape. A concave portion 158_cr_ may be formed on the second side surface 158_c_2 of the third cap 158_c_.

The concave portions 158_ar_ and 158_br_ are formed on the first side surface 158_a_1 of the first cap 158_a_ and the first side surface 158_b_1 of the second cap 158_b_ facing each other. The first side 158_a_1 of the first cap 158_a_ and the first side 158_b_1 of the second cap 158_b_ are etched by the primary patterning process, then exposed by the secondary patterning process and additionally etched, and thus the concave portions 158_ar_ and 158_r_ are formed. The second side surface 158_a_2 of the first cap 158_a_ and the first side surface 158_c_1 of the third cap 158_c_ facing each other may each have a flat shape. Since the second side surface 158_a_2 of the first cap 158_a_ and the first side surface 158_c_1 of the third cap 158_c_ are not etched in the primary patterning process and are etched only in the secondary patterning process, a separate concave portion might not be formed. The two opposite sides of the bit line capping layer 158 positioned on one side based on the direct contact DC may have a concave shape, and the two opposite sides of the bit line capping layer 158 positioned on the other side have a flat shape. However, it is not necessarily limited thereto, and may be made opposite to that described above.

Figure 21:
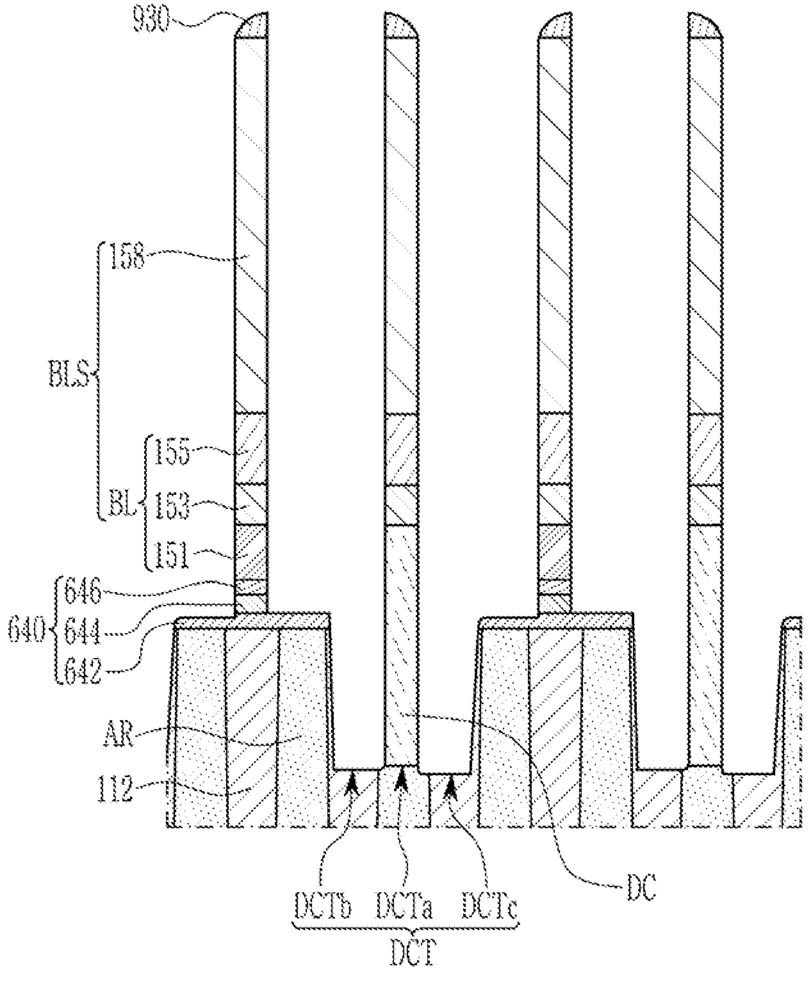

As shown in FIG. 21, the remaining protective layer 710 may be removed by performing an etching process, a strip process, an ashing process, and the like. Both sides of the bit line structure BLS and both sides of the direct contact DC may be exposed by removing the protective layer 710. In addition, the bottom and side surfaces of the second portion DCTb of the direct contact trench DCT may be exposed again.

Figure 22:
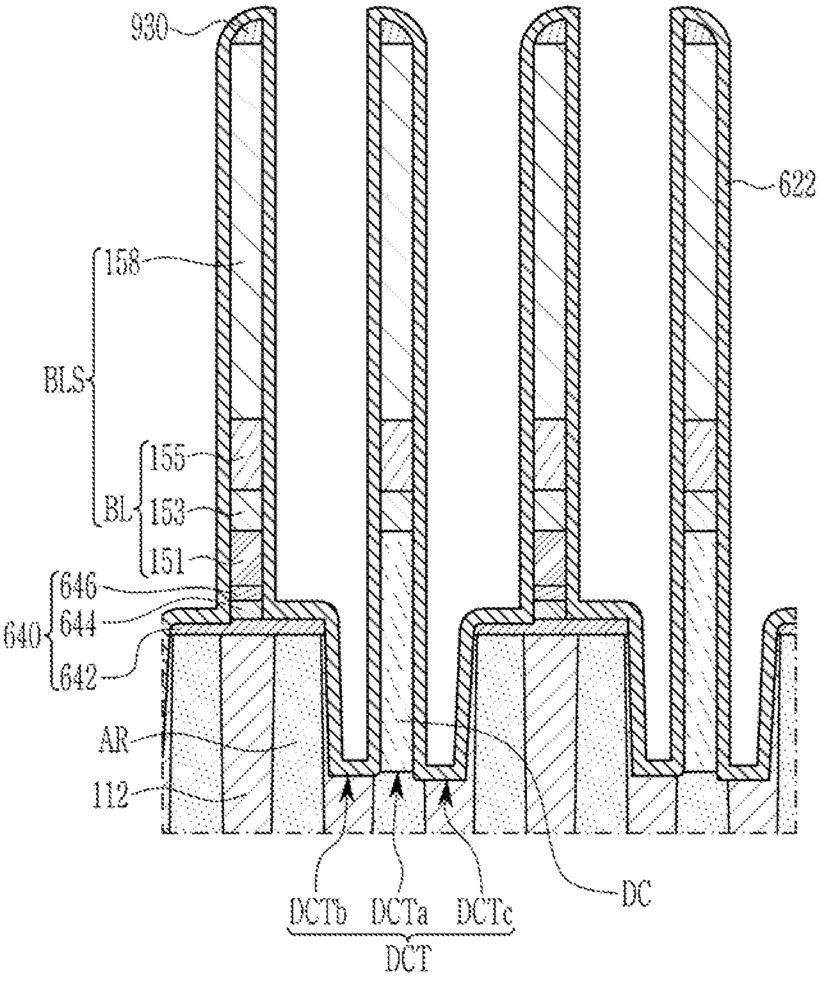

As shown in FIG. 22, a first spacer 622 may be formed using an insulating material on the bit line structure BLS.

The first spacer 622 may be formed with a conformal shape on the bit line structure BLS. The first spacer 622 may cover the side of the bit line structure BLS and the direct contact DC. The first spacer 622 may cover the upper and side surfaces of the third hard mask pattern 930. The first spacer 622 may cover the side surfaces of the second insulation layer 644 and the third insulation layer 646, and may cover the upper surface and side surfaces of the first insulation layer 642. The first spacer 622 may cover the bottom surface and sidewall of the second portion DCTb and the third portion DCTc of the direct contact trench DCT.

Figure 23:
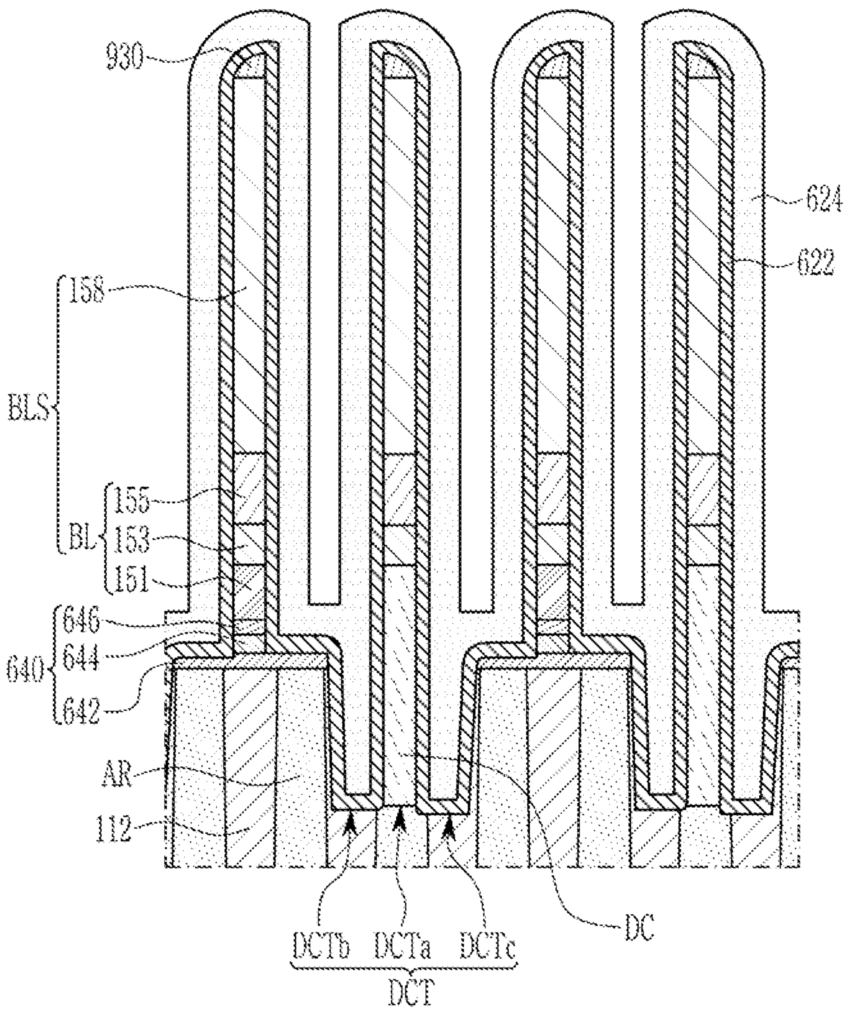

As shown in FIG. 23, a second spacer 624 may be formed on the first spacer 622 by using an insulating material. The second spacer 624 may be formed with a conformal shape on the first spacer 622. The thickness of the second spacer 624 may be thicker than that of the first spacer 622, but is not necessarily limited thereto. The second spacer 624 may fill the second portion DCTb and the third portion DCTc of the direct contact trench DCT.

Figure 24:
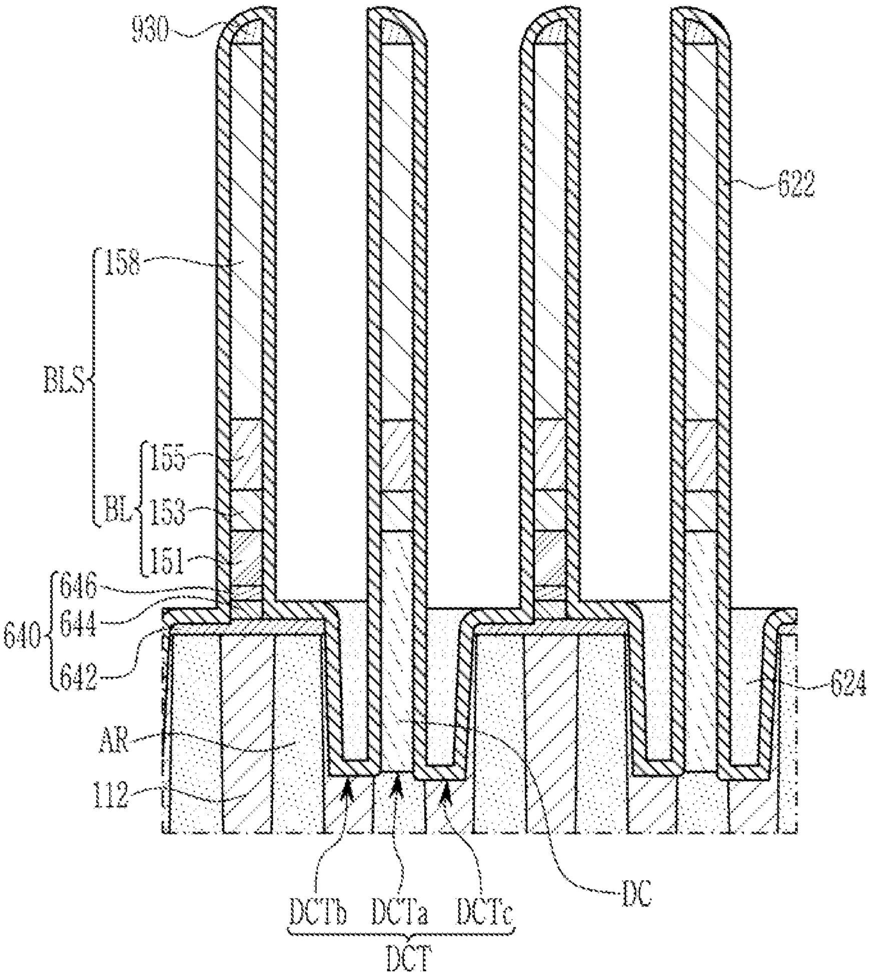

As shown in FIG. 24, the second spacer 624 may be patterned to leave a portion of the second spacer 624 disposed in the direct contact trench DCT, and the remaining portion may be removed. A part of the second spacer 624 covering the bit line structure BLS may be removed.

Figure 25:
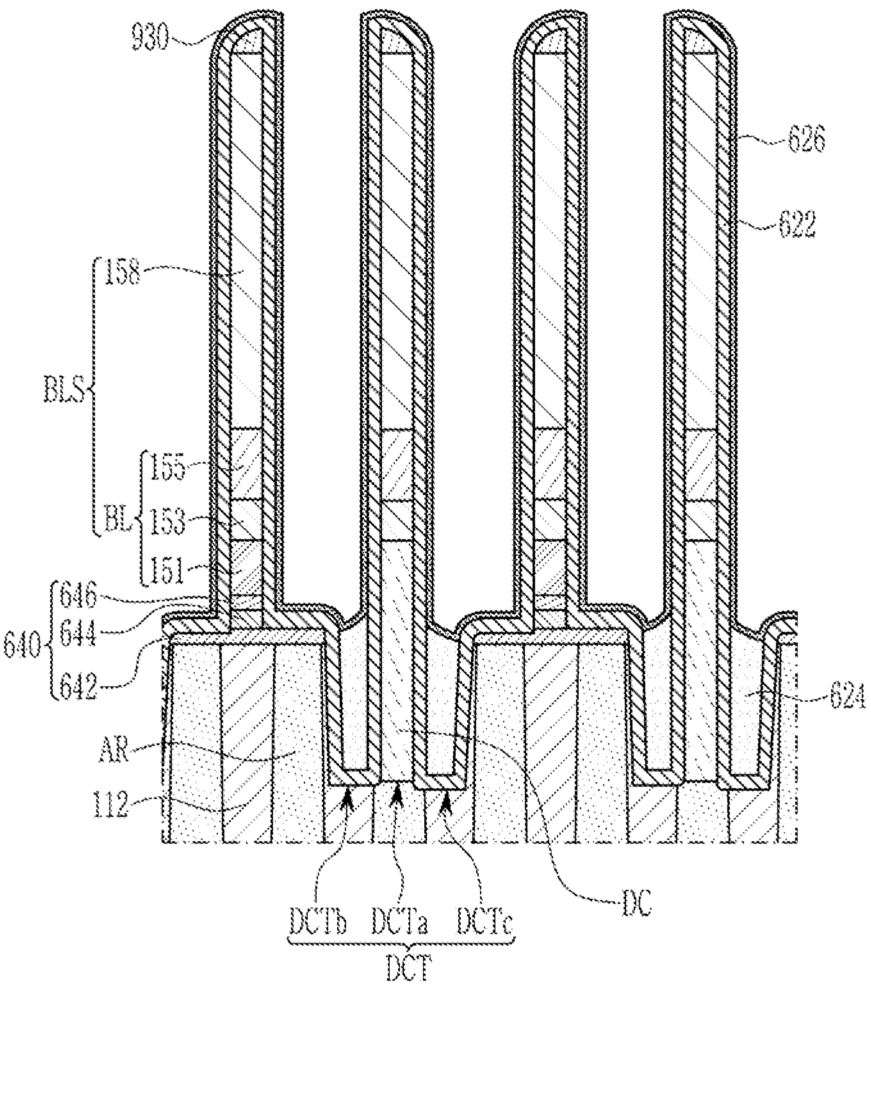

As shown in FIG. 25, a third spacer 626 may be formed using an insulating material on the first spacer 622 and the second spacer 624. The third spacer 626 may be formed with a conformal shape on the first spacer 622 and the second spacer 624. A thickness of the third spacer 626 may be thinner than a thickness of the first spacer 622 and the second spacer 624, but is not necessarily limited thereto.

Figure 26:
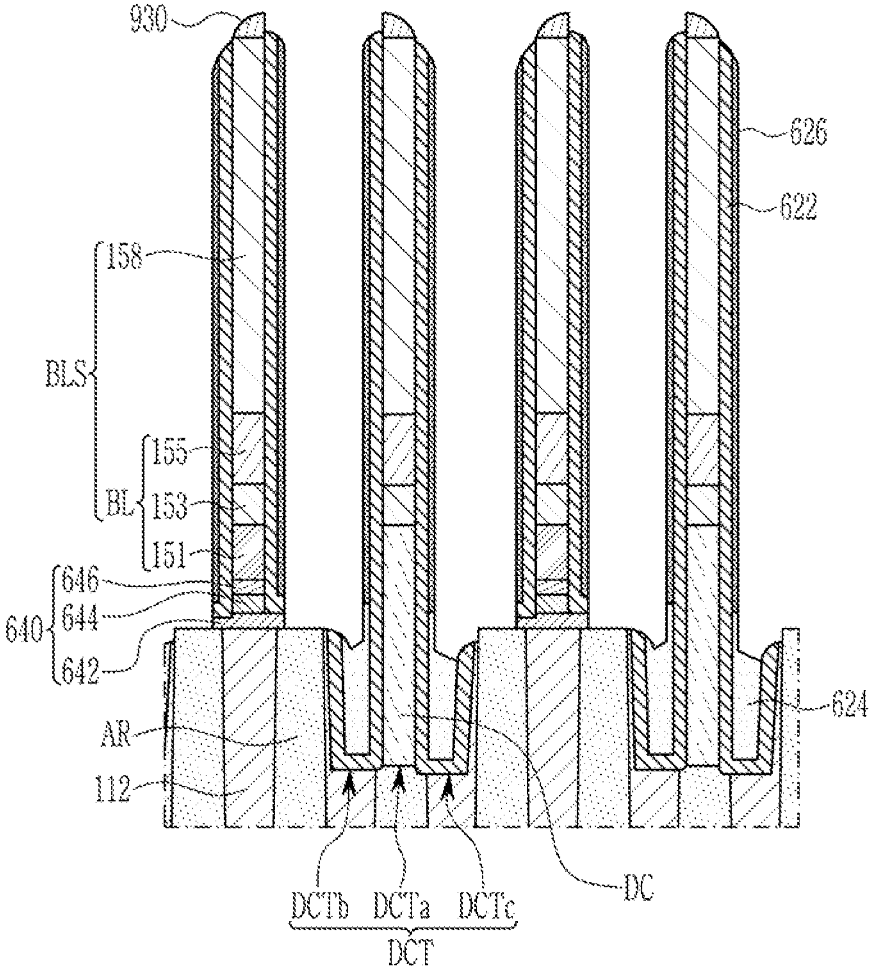

As shown in FIG. 26, the third spacer 626 and the first spacer 622 may be patterned by an anisotropic etching process. The third hard mask pattern 930 may be exposed by removing the first spacer 622 and the third spacer 626 disposed on the bit line structure BLS. The active region AR disposed between the bit line structure BLSs may be exposed by removing the first spacer 622 and the third spacer 626 disposed between the bit line structures BLS.

Figure 27:
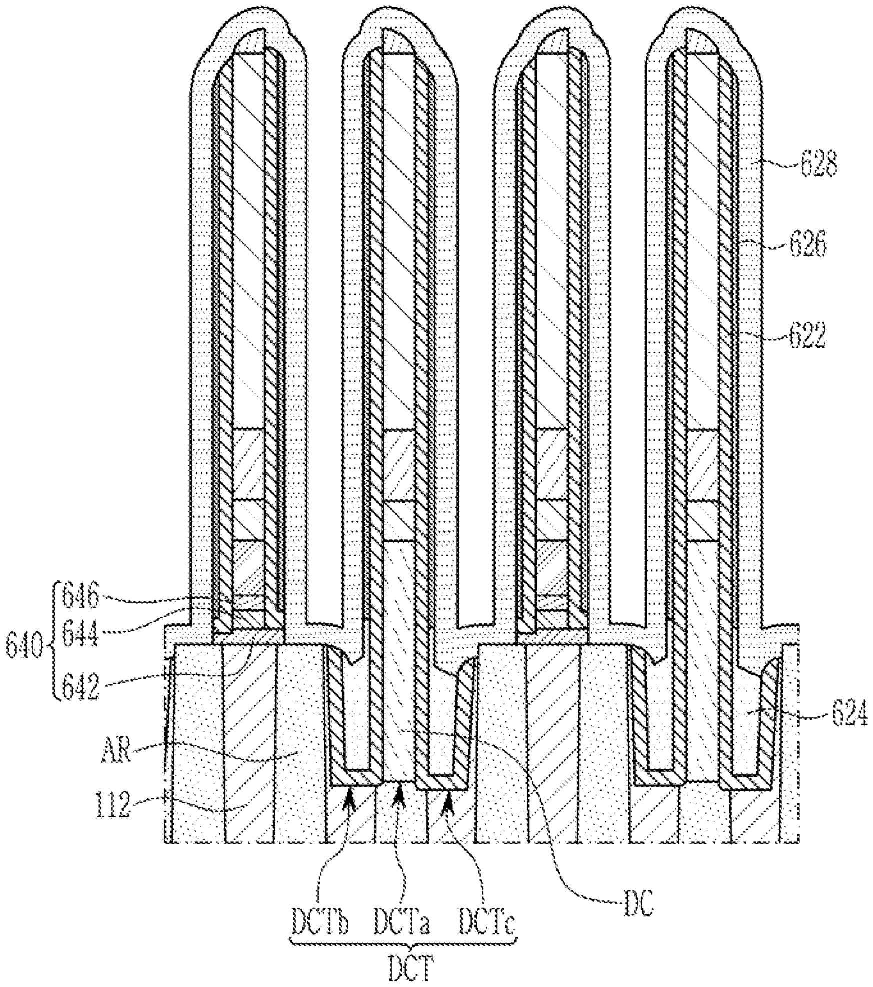

As shown in FIG. 27, a fourth spacer 628 may be formed on the third spacer 626 by using an insulating material. The fourth spacer 628 may be formed with a conformal shape on the third spacer 626. The first spacer 622, the second spacer 624, the third spacer 626, and the fourth spacer 628 may form the spacer structure 620.

Figure 28:
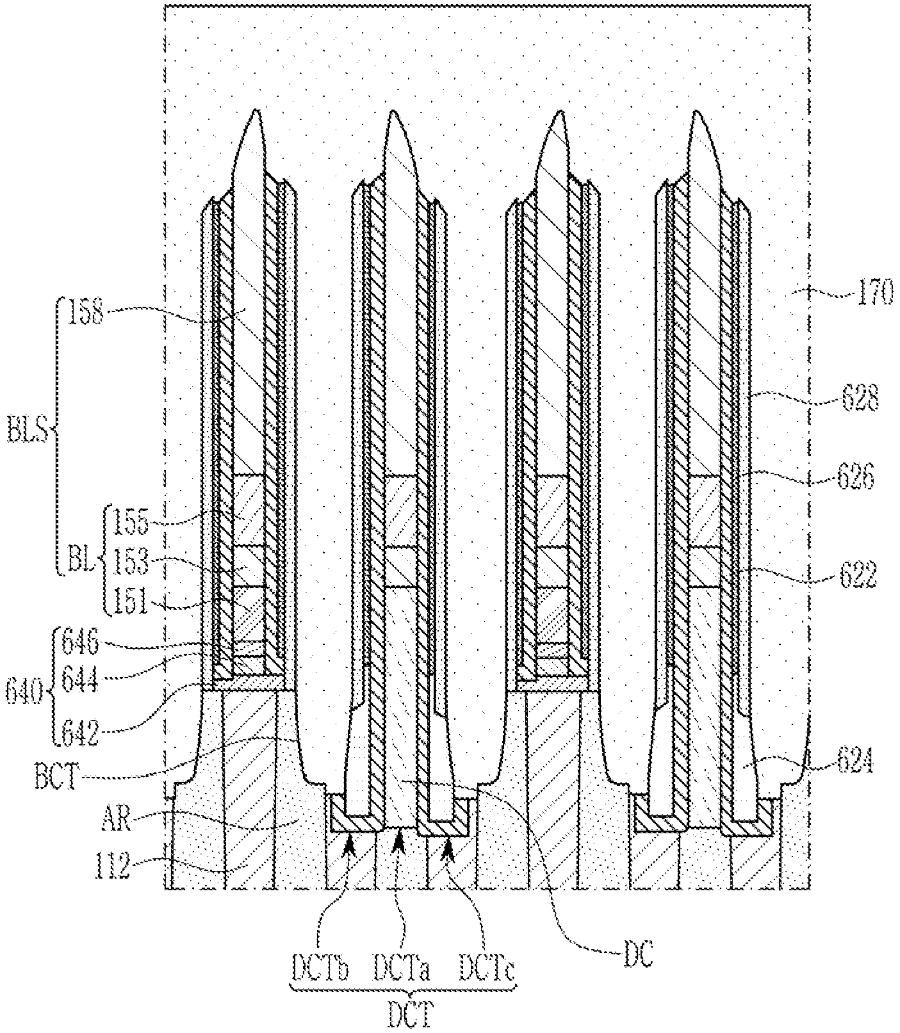

As shown in FIG. 28, the fourth spacer 628 may be patterned. A third hard mask pattern 930 may be exposed by removing the fourth spacer 628 disposed on the bit line structure BLS. The active region AR disposed between the bit line structures BLS may be exposed by removing the fourth spacer 628 disposed between the bit line structures BLS.

Subsequently, an etching process may be performed to remove at least a part of the active region AR to form a buried contact trench BCT. In this case, at least a part of the element isolation layer 112, the first spacer 622, and the second spacer 624 disposed around the active region AR may be removed together. In addition, the third hard mask pattern 930 may be removed, and thus an upper surface of the bit line capping layer 158 may be exposed, and at least a part of the bit line capping layer 158 may be removed together. In addition, at least a part of the first spacer 622, the third spacer 626, and the fourth spacer 628 disposed around the bit line capping layer 158 may be removed together.

Subsequently, a conductive material layer 170 may be formed on the bit line structure BLS. The conductive material layer 170 may be formed between the bit line structures BLS. A buried contact trench BCT may be filled by a conductive material layer 170. Accordingly, the conductive material layer 170 may contact the active region AR. The conductive material layer 170 may include a conductive material. For example, the conductive material layer 170 may include polysilicon doped with an impurity, but is not necessarily limited thereto.

The conductive material layer 170 is patterned such that the buried contact BC may be formed as shown in FIG. 2. The buried contact BC may be electrically connected to the active region AR.

Subsequently, a landing pad LP connected to a buried contact BC may be formed, and an insulation pattern 660 separating the landing pads LP may be formed. A capacitor structure may be further formed on the landing pad LP. The capacitor structure may be electrically connected to the active region AR through the landing pad LP and the buried contact BC.

Next, referring to FIG. 29 to FIG. 33, a method of manufacturing a semiconductor device according to an embodiment will be described.

FIG. 29 to FIG. 33 are process cross-sectional views that sequentially show a manufacturing method of a semiconductor device according to an embodiment.

A manufacturing method of a semiconductor device according to an embodiment shown in FIG. 29 to FIG. 33 is almost the same as the manufacturing method of the semiconductor device according to the embodiment shown in FIG. 7 to FIG. 28, and therefore to the extent that a detailed description of an element has been omitted, it may be assumed that the element is at least similar to corresponding elements that are described elsewhere within the present disclosure. In addition, the same reference numeral is used for the same constituent element as the previous embodiment. In the present embodiment, a layer etched in the primary patterning process and the secondary patterning process is partially different from the previous embodiment, and will be described below.

Figure 29:
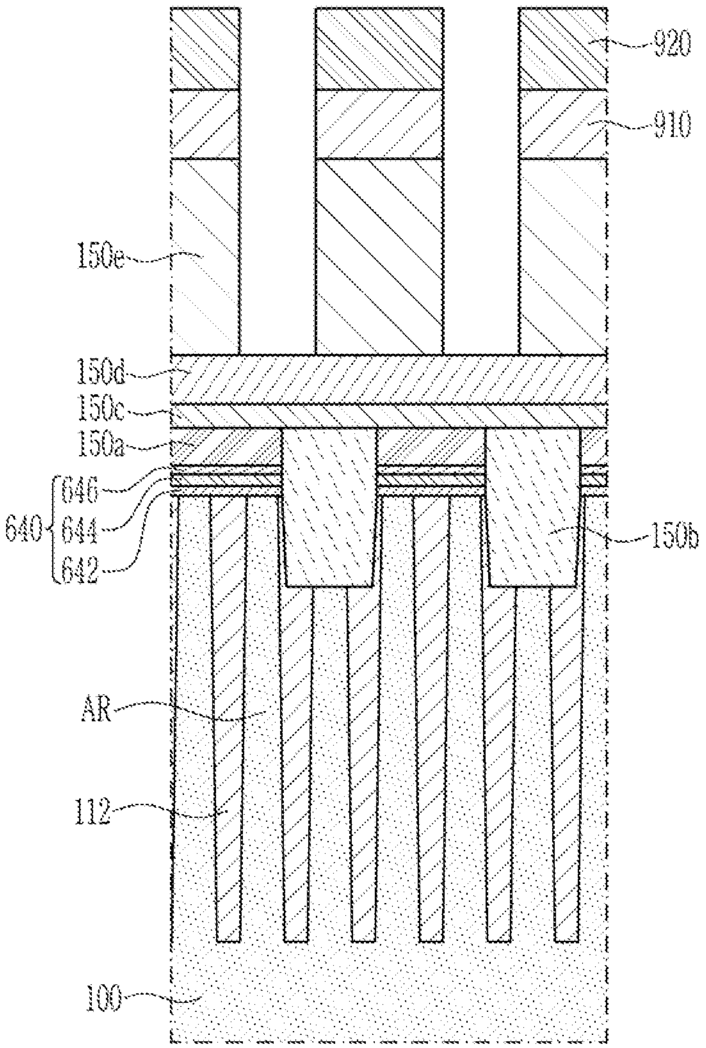
FIG. 29 to FIG. 33 are process cross-sectional views that sequentially show a manufacturing method of a semiconductor device according to an embodiment of the present disclosure.

As shown in FIG. 29, as in the previous embodiment, an element isolation layer 112 is formed on a substrate 100 to define an active region AR, and an insulation layer 640, a first material layer 150*a*, a second material layer 150*b*, a third material layer 150*c*, a fourth material layer 150*d*, a fifth material layer 150*e*, and the like may be formed on the substrate 100. A first hard mask pattern 910 and a second hard mask pattern 920 may be formed on the fifth material layer 150*e*.

In the primary patterning process of the previous embodiment, the fifth material layer 150*e*, the fourth material layer 150*d*, the third material layer 150*c*, the second material layer 150*b*, and the first material layer 150*a* may be simultaneously patterned using the first hard mask pattern 910 and the second hard mask pattern 920 as masks. In the primary patterning process of the present embodiment, only the fifth material layer 150*e* may be patterned using the first hard mask pattern 910 and the second hard mask pattern 920 as masks, and the fourth material layer 150*d*, the third material layer 150*c*, the second material layer 150*b*, and the first material layer 150*a* remain without being patterned.

Figure 30:
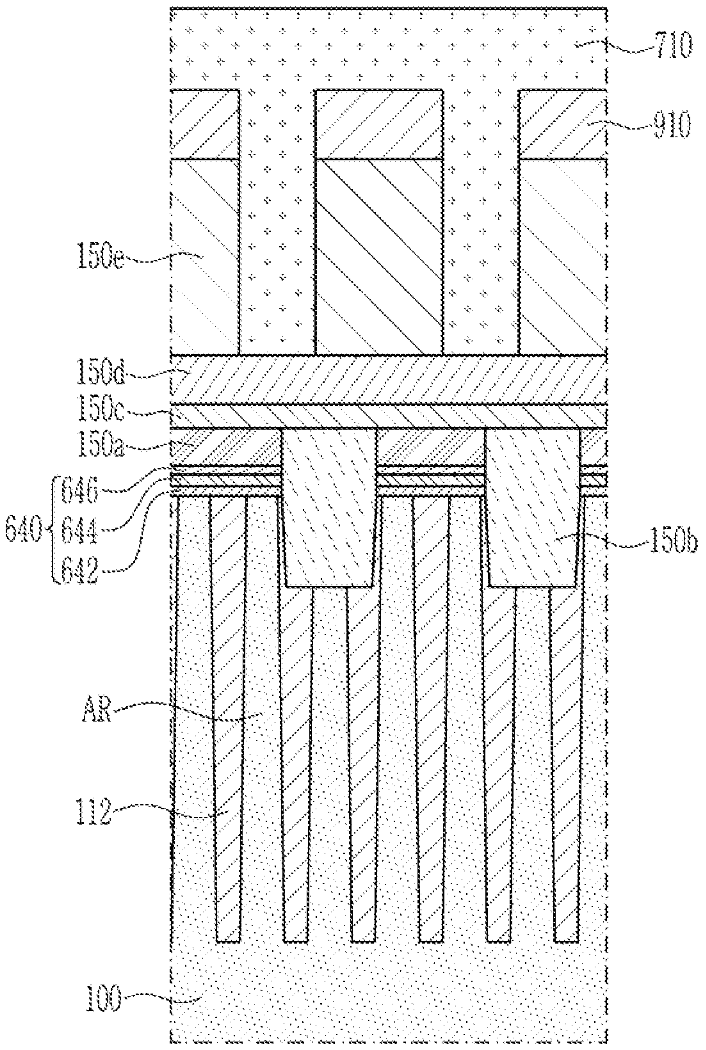

As shown in FIG. 30, the second hard mask pattern 920 may be removed. When the second hard mask pattern 920 is completely removed, the first hard mask pattern 910 may be exposed. A protective layer 710 may be formed on the first hard mask pattern 910. The protective layer 710 may fill an open portion of the first hard mask pattern 910 and a removed portion of the fifth material layer 150*e* corresponding thereto.

Figure 31:
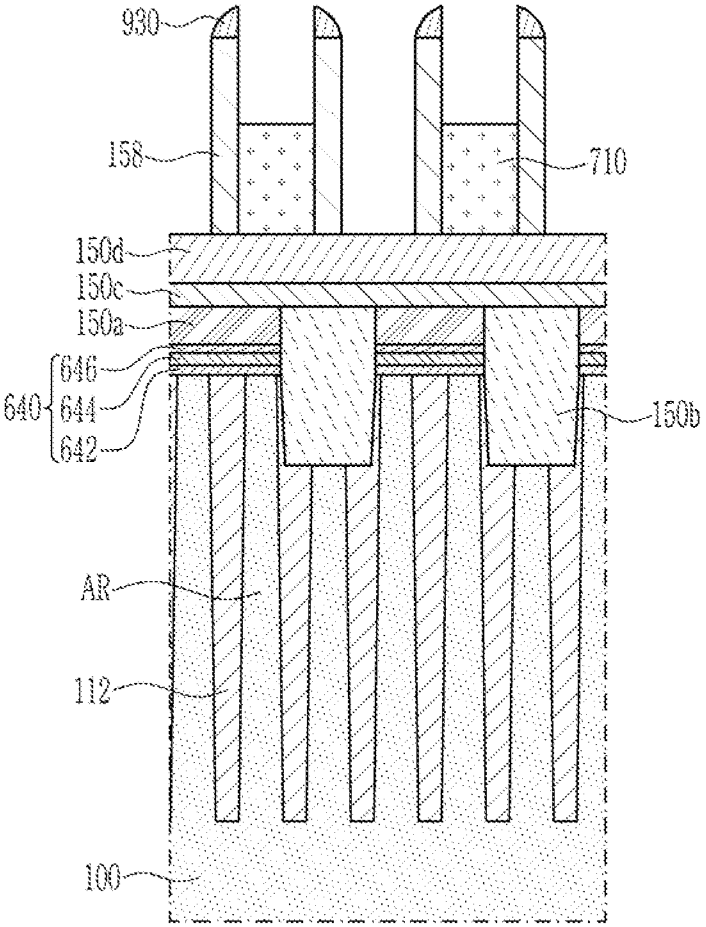

Next, after at least a part of the protective layer 710 is removed to expose the first hard mask pattern 910, the first hard mask pattern 910 may be removed. As shown in FIG. 31, the third hard mask pattern 930 may be formed.

In the secondary patterning process of the previous embodiment, the fifth material layer 150*e*, the fourth material layer 150*d*, the third material layer 150*c*, the second material layer 150*b*, and the first material layer 150*a* may be simultaneously patterned using the third hard mask pattern 930 as a mask. A direct contact DC and a bit line structure BLS may be formed through a secondary patterning process. In the secondary patterning process of the present embodiment, the fifth material layer 150*e* may be patterned using the third hard mask pattern 930 as a mask, and the fourth material layer 150*d*, the third material layer 150*c*, the second material layer 150*b*, and the first material layer 150*a* may remain without being patterned. The bit line capping layer 158 of the bit line structure BLS may be formed through the secondary patterning process.

During patterning, at least a portion of the third hard mask pattern 930 and at least a portion of the protective layer 710 may be removed together. For example, the thickness of the third hard mask pattern 930 and the thickness of the protective layer 710 may be reduced.

Figure 32:
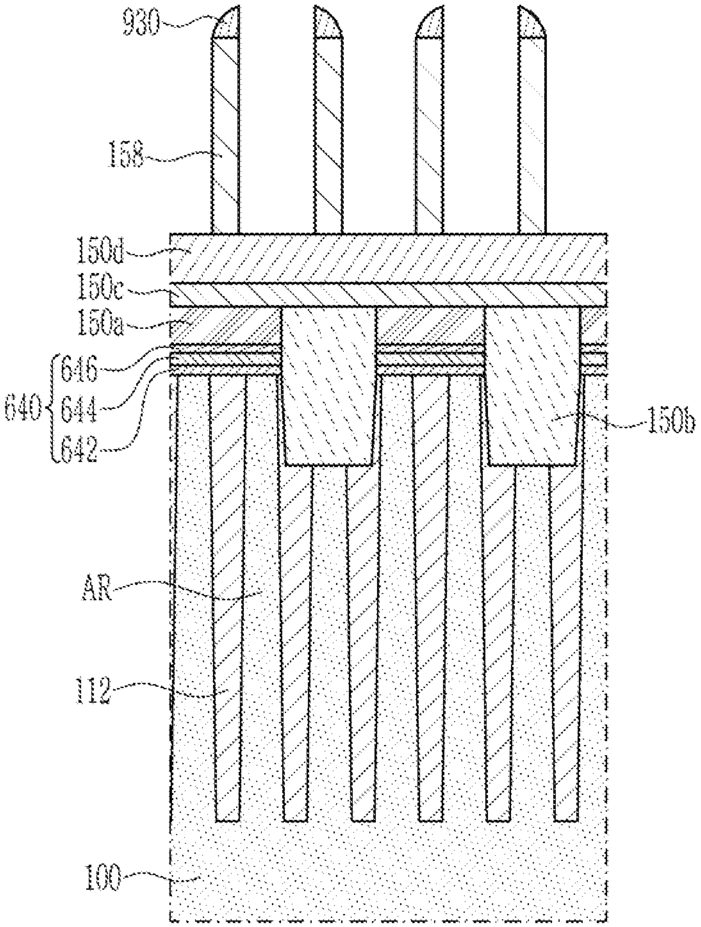

As shown in FIG. 32, the protective layer 710 may be removed.

Figure 33:
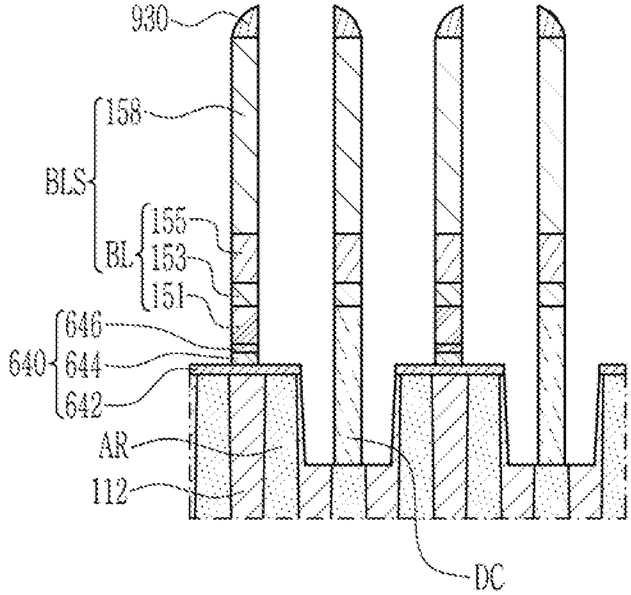

As shown in FIG. 33, a third patterning process may be additionally performed by using the third hard mask pattern 930 as a mask. In the third patterning process, the fourth material layer 150*d*, the third material layer 150*c*, the second material layer 150*b*, and the first material layer 150*a* may be patterned. The bit line BL of the direct contact DC and the bit line structure BLS may be formed through the third patterning process.

In the present embodiment, a height difference of the bottom surface of the direct contact trench DCT and a thickness difference of the first insulation layer 642 might not occur. Both sides of the bit line capping layer 158 may have asymmetrical shapes, and a concave portion may be formed on one side.

After that, as in the previous embodiment, spacers may be formed, and buried contacts, landing pads, and the like may be formed.

Next, referring to FIG. 34 to FIG. 37, a method of manufacturing a semiconductor device according to an embodiment is described as follows.

FIG. 34 to FIG. 37 are process cross-sectional views that sequentially show a method of manufacturing a semiconductor device according to an embodiment.

A manufacturing method of a semiconductor device according to an embodiment shown in FIG. 34 to FIG. 37 may be similar to the manufacturing method of the semiconductor device according to the embodiment shown in FIG. 7 to FIG. 28, and therefore to the extent that a detailed description of an element has been omitted, it may be assumed that the element is at least similar to corresponding elements that are described elsewhere within the present disclosure. In addition, the same reference numeral is used for the same constituent element as the previous embodiment. In the present embodiment, a layer etched in the primary patterning process and the secondary patterning process is partially different from the previous embodiment, and will be described below.

Figure 34:
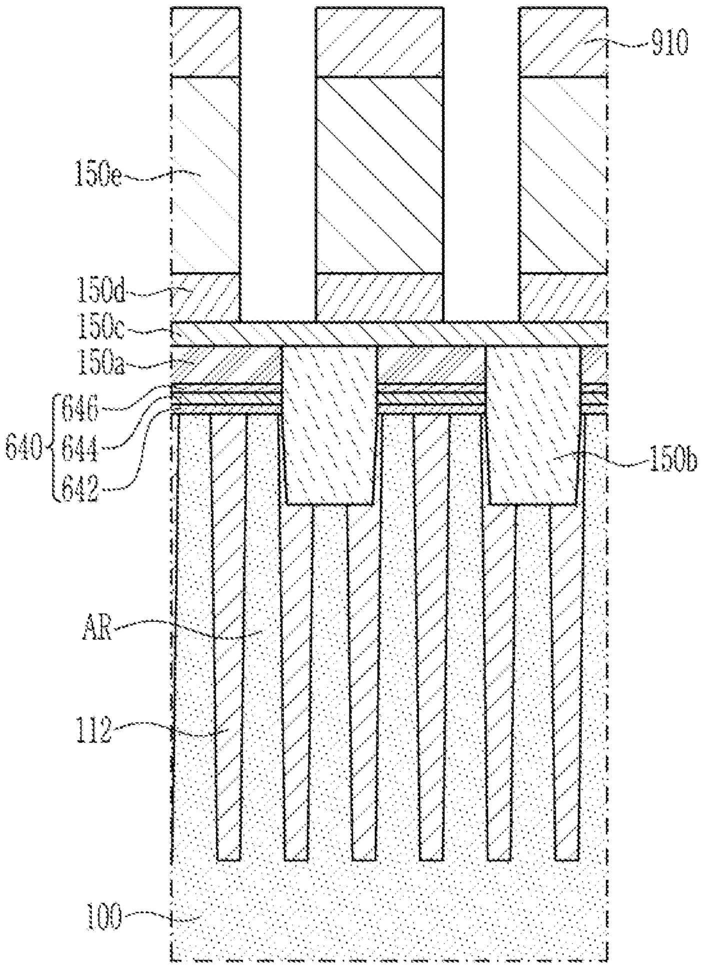
FIG. 34 to FIG. 37 are process cross-sectional views that sequentially show a method of manufacturing a semiconductor device according to an embodiment of the present disclosure.

As shown in FIG. 34, as in the previous embodiment, an active region AR is defined by forming an element isolation layer 112 on a substrate 100, and an insulation layer 640, a first material layer 150*a*, a second material layer 150*b*, a third material layer 150*c*, a fourth material layer 150*d*, a fifth material layer 150*e*, and the like may be formed on the substrate 100. A first hard mask pattern 910 and a second hard mask pattern may be formed on the fifth material layer 150*e*.

In the primary patterning process of the previous embodiment, the fifth material layer 150*e*, the fourth material layer 150*d*, the third material layer 150*c*, the second material layer 150*b*, and the first material layer 150*a* may be patterned simultaneously. In the primary patterning process of the present embodiment, only the fifth material layer 150*e* and the fourth material layer 150*d* may be patterned, and the third material layer 150*c*, the second material layer 150*b*, and the first material layer 150*a* remain as they are.

Figure 35:
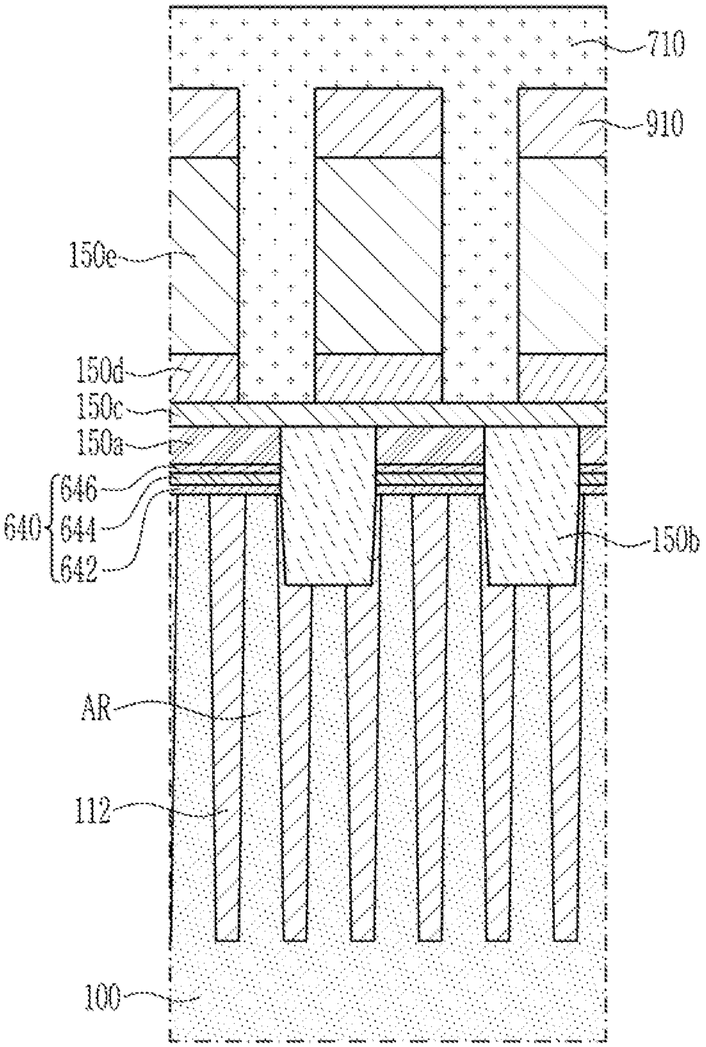

As shown in FIG. 35, the second hard mask pattern may be removed, and the protective layer 710 may be formed on the first hard mask pattern 910. The protective layer 710 may fill an open portion of the first hard mask pattern 910 and a portion where the fifth material layer 150*e* and the fourth material layer 150*d* are removed.

Figure 36:
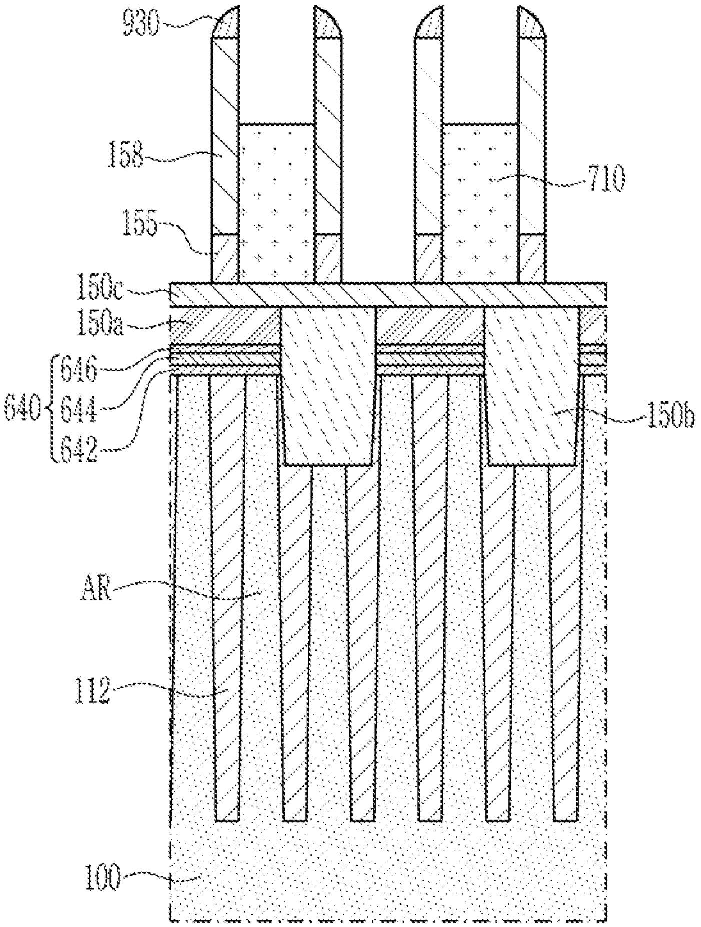

Next, after at least a part of the protective layer 710 is removed to expose the first hard mask pattern 910, the first hard mask pattern 910 may be removed. As shown in FIG. 36, the third hard mask pattern 930 may be formed.

In the secondary patterning process of the previous embodiment, the fifth material layer 150*e*, the fourth material layer 150*d*, the third material layer 150*c*, the second material layer 150*b*, and the first material layer 150*a* may be simultaneously patterned using the third hard mask pattern 930 as a mask. A direct contact DC and a bit line structure BLS may be formed through a secondary patterning process. In the secondary patterning process of the present embodiment, the fifth material layer 150*e* and the fourth material layer 150*d* may be patterned using the third hard mask pattern 930 as a mask, and the third material layer 150*c*, the second material layer 150*b*, and the first material layer 150*a* may remain as they are. Through the secondary patterning process, a bit line capping layer 158 of the bit line structure BLS and a third conductive layer 155 of the bit line BL may be formed.

During patterning, at least a portion of the third hard mask pattern 930 and at least a portion of the protective layer 710 may be removed together. For example, a thickness of the third hard mask pattern 930 and a thickness of the protective layer 710 may be reduced.

Figure 37:
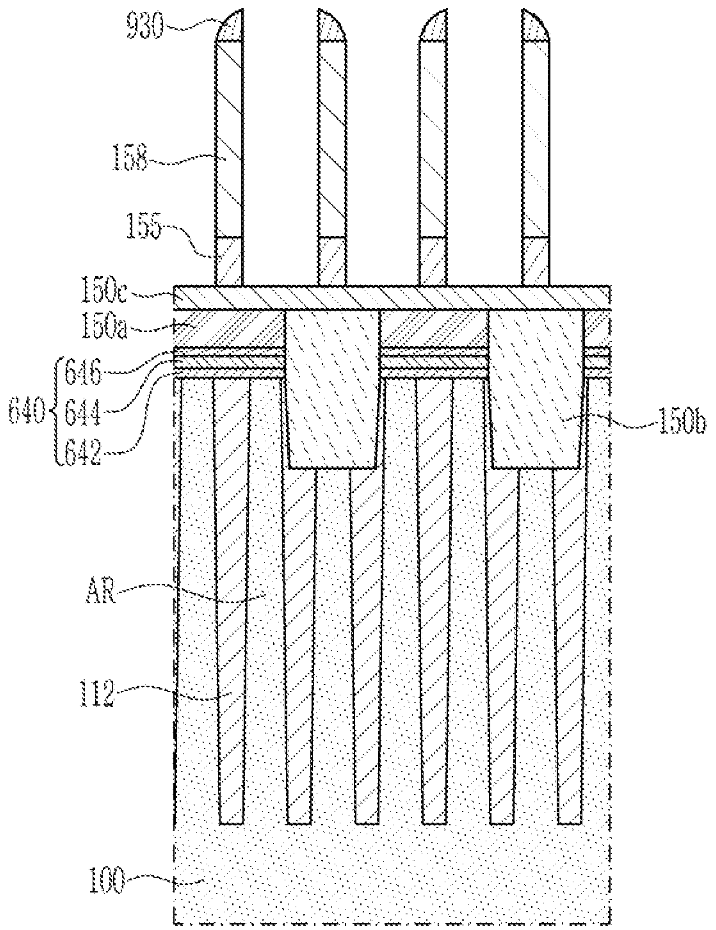

As shown in FIG. 37, the protective layer 710 may be removed.

A third patterning process may be additionally performed by using the third hard mask pattern 930 as a mask. In the third patterning process, the third material layer 150*c*, the second material layer 150*b*, and the first material layer 150*a* may be patterned. Through the third patterning process, the direct contact DC and a first conductive layer and a second conductive layer of the bit line of the bit line structure may be formed.

In the present embodiment, a height difference of the bottom surface of the direct contact trench DCT and a thickness difference of the first insulation layer 642 might not occur. Both sides of the bit line capping layer 158 may have asymmetrical shapes, and a concave portion may be formed on one side.

After that, as in the previous embodiment, spacers may be formed, and buried contacts, landing pads, and the like may be formed.

Next, referring to FIG. 38 to FIG. 41, a method of manufacturing a semiconductor device according to an embodiment is described as follows.

FIG. 38 to FIG. 41 are process cross-sectional views that sequentially show a method of manufacturing a semiconductor device according to an embodiment.

A manufacturing method of a semiconductor device according to an embodiment shown in FIG. 38 to FIG. 41 is almost the same as the manufacturing method of the semiconductor device according to the embodiment shown in FIG. 7 to FIG. 28, and therefore to the extent that a detailed description of an element has been omitted, it may be assumed that the element is at least similar to corresponding elements that are described elsewhere within the present disclosure. In addition, the same reference numeral is used for the same constituent element as the previous embodiment. In the present embodiment, a layer etched in the primary patterning process and the secondary patterning process is partially different from the previous embodiment, and will be described below.

Figure 38:
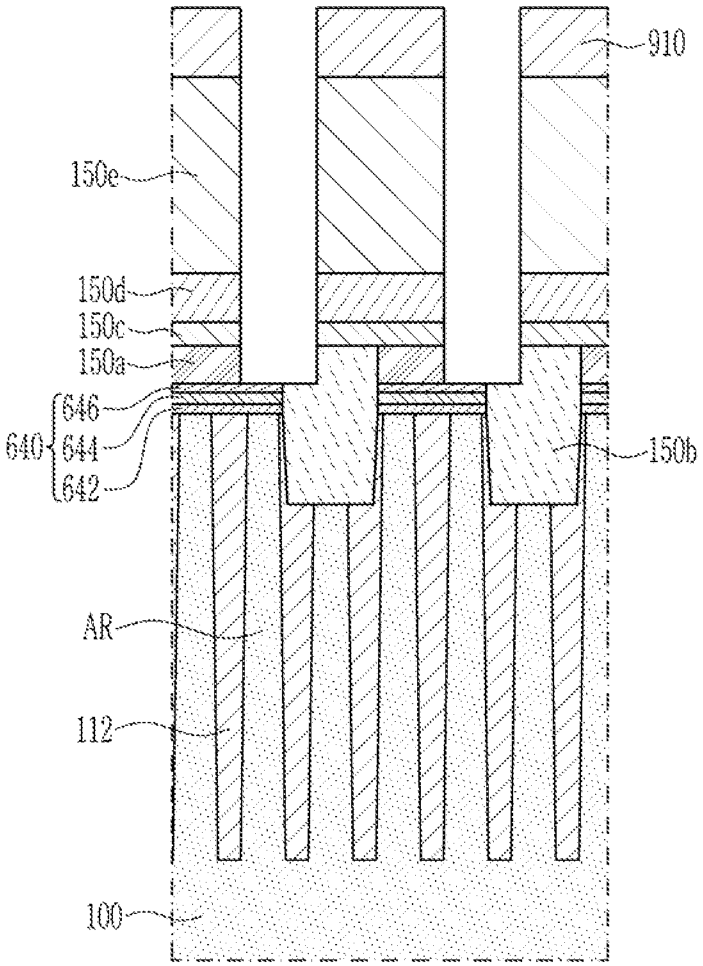
FIG. 38 to FIG. 41 are process cross-sectional views that sequentially show a method of manufacturing a semiconductor device according to an embodiment of the present disclosure.

As shown in FIG. 38, as in the previous embodiment, an active region AR is defined by forming an element isolation layer 112 on a substrate 100, and an insulation layer 640, a first material layer 150*a*, a second material layer 150*b*, a third material layer 150*c*, a fourth material layer 150*d*, a fifth material layer 150*e*, and the like may be formed on the substrate 100. A first hard mask pattern 910 and a second hard mask pattern may be formed on the fifth material layer 150*e*.

In the primary patterning process, the fifth material layer 150*e*, the fourth material layer 150*d*, the third material layer 150*c*, the second material layer 150*b*, and the first material layer 150*a* may be simultaneously patterned. In the primary patterning process of the previous embodiment, a portion of the second material layer 150*b* disposed within the direct contact trench DCT and at least a portion of the insulation layer 640 adjacent thereto may be removed together. In the primary patterning process of the present embodiment, a portion of the second material layer 150*b* disposed in the direct contact trench DCT and an insulation layer 640 adjacent thereto remain without being removed.

Figure 39:
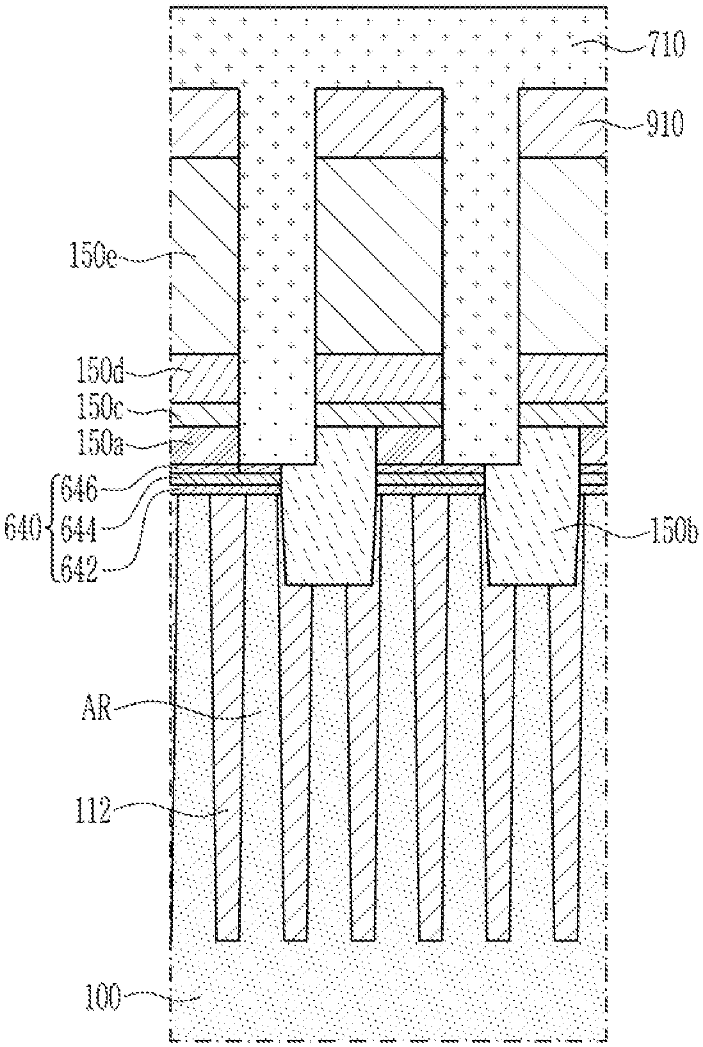

As shown in FIG. 39, the second hard mask pattern may be removed, and a protective layer 710 may be formed on the first hard mask pattern 910. The protective layer 710 is formed to fill an open portion of the first hard mask pattern 910 and correspondingly removed portions of the fifth material layer 150*e*, the fourth material layer 150*d*, the third material layer 150*c*, the second material layer 150*b*, and the first material layer 150*a*.

Figure 40:
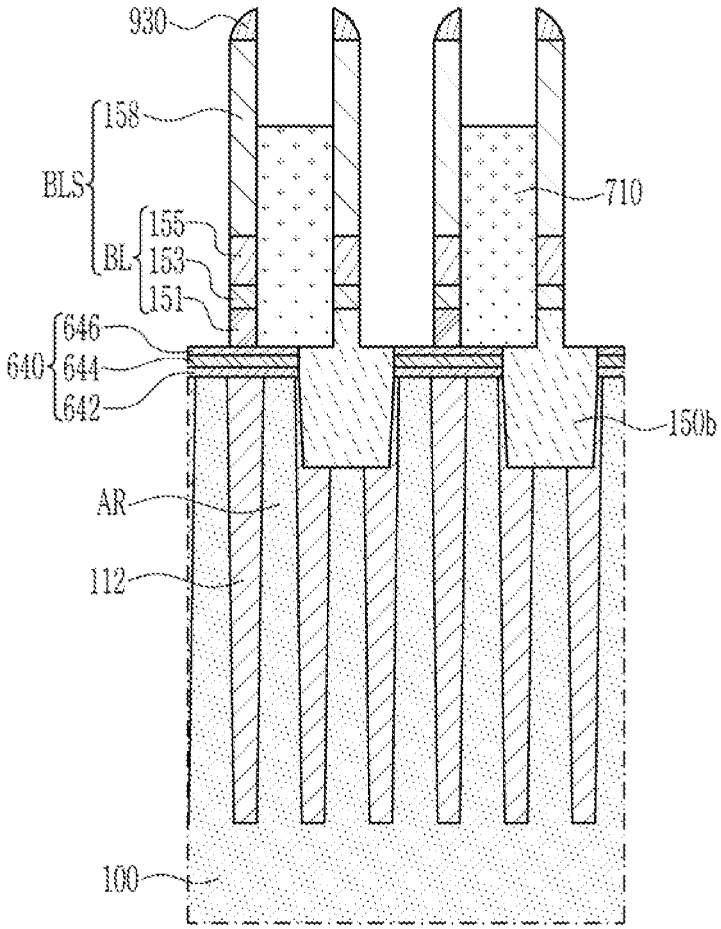

Next, after at least a portion of the protective layer 710 is removed to expose the first hard mask pattern 910, the first hard mask pattern 910 may be removed. As shown in FIG. 40, a third hard mask pattern 930 may be formed.

In the secondary patterning process, the fifth material layer 150*e*, the fourth material layer 150*d*, the third material layer 150*c*, the second material layer 150*b*, and the first material layer 150*a* may be simultaneously patterned using the third hard mask pattern 930 as a mask. A bit line structure BLS may be formed through the secondary patterning process. In the secondary patterning process of the previous embodiment, a portion of the second material layer 150*b* disposed within the direct contact trench DCT and at least a portion of the insulation layer 640 adjacent thereto may be removed together. In the secondary patterning process of the present embodiment, the portion of the second material layer 150*b* disposed in the direct contact trench DCT and the insulation layer 640 adjacent thereto remain without being removed.

During patterning, at least a portion of the third hard mask pattern 930 and at least a portion of the protective layer 710 may be removed together. For example, a thickness of the third hard mask pattern 930 and a thickness of the protective layer 710 may be reduced.

Figure 41:
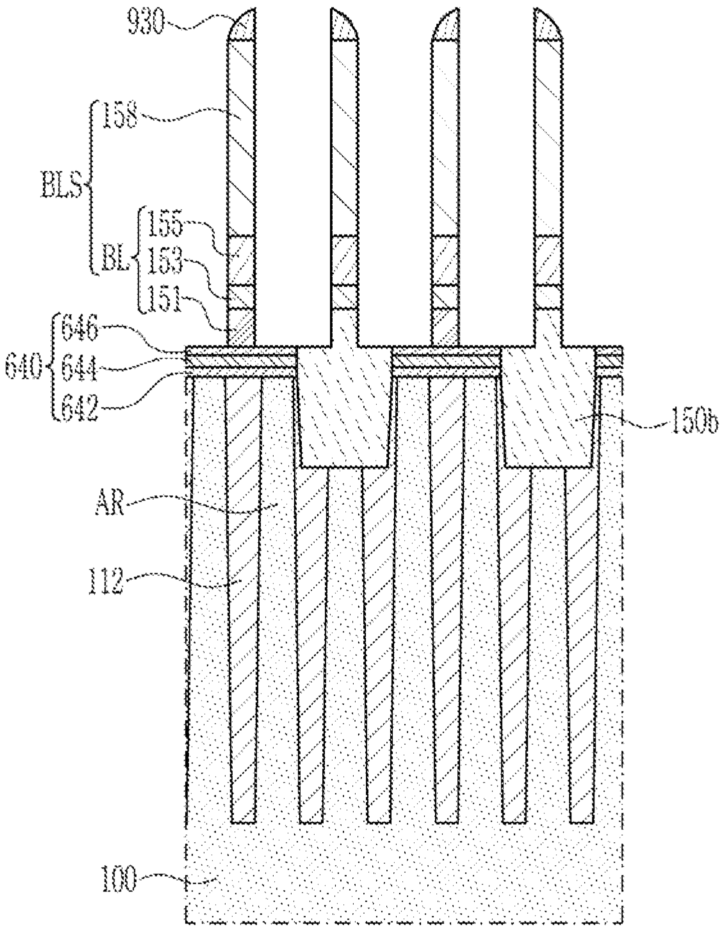

As shown in FIG. 41, the protective layer 710 may be removed.

A third patterning process may be additionally performed by using the third hard mask pattern 930 as a mask. In the third patterning process, the second material layer 150*b* disposed within the direct contact trench DCT may be patterned. A direct contact DC can be formed through the third patterning process.

In the present embodiment, a height difference of the bottom surface of the direct contact trench DCT and a thickness difference of the first insulation layer 642 might not occur. Both sides of the bit line capping layer 158 may have asymmetrical shapes, and a concave portion may be formed on one side.

After that, as in the previous embodiment, spacers may be formed, buried contacts, landing pads, and the like may be formed.

Although an embodiment has been described in detail above, the scope of the present invention is not necessarily limited thereto, and various modifications of a person of ordinary skill in the art using the basic concept of the present disclosure.

What is claimed is:

1. A semiconductor device, comprising:
a substrate including an active region;
a word line and a bit line that overlap the active region;
a bit line capping layer that is disposed on the bit line, the bit line capping layer having a first side and a second side opposite to the first side;
a direct contact that electrically connects the active region and the bit line to each other;
a buried contact that is electrically connected to the active region;
a landing pad disposed on the buried contact; and
an insulation pattern disposed at opposite sides of the landing pad,
wherein the first and second sides of the bit line capping layer are asymmetric to each other at a level below the insulation pattern in a vertical direction.

2. The semiconductor device of claim 1, wherein
the first side of the bit line capping layer has a concave shape, and
the second side of the bit line capping layer has a flat shape.

3. The semiconductor device of claim 2, wherein
the bit line capping layer comprises:
a first cap that overlaps the direct contact; and
a second cap and a third cap that are disposed at opposite sides of the first cap,
the first cap comprises a first side and a second side opposite to the first side,
the first side of the first cap is concave, and
the second side of the first cap has a flat shape.

4. The semiconductor device of claim 3, wherein
the second cap and the third cap each include a first side and a second side opposite to the first side, respectively,
the first side of the second cap faces the first side of the first cap,
the first side of the second cap is concave,
the second side of the second cap has a flat shape,
the first side of the third cap faces the second side of the first cap,
the first side of the third cap has a flat shape, and
the second side of the third cap is concave.

5. The semiconductor device of claim 4, wherein
the first cap, the second cap, and the third cap overlap the bit line, and
the second cap and the third cap do not overlap the direct contact.

6. The semiconductor device of claim 1, wherein
a direct contact trench is formed in the substrate,
the direct contact trench comprises:
a first portion where the direct contact is disposed; and
a second portion and a third portion that are disposed at opposite sides of the first portion, and
a height of a bottom surface of the second portion of the direct contact trench and a height of a bottom surface of the third portion of the direct contact trench are different from each other.

7. The semiconductor device of claim 6, further comprising an element isolation layer that is disposed in the substrate and defines the active region,
wherein the first portion of the direct contact trench is disposed on the active region, and
the second portion and the third portion of the direct contact trench are disposed on the element isolation layer.

8. The semiconductor device of claim 7, further comprising a first insulation layer disposed between the bit line and the element isolation layer, and
wherein a thickness of the first insulation layer varies according to position.

9. The semiconductor device of claim 8, wherein
the first insulation layer comprises:
a first portion overlapping the bit line; and
a second portion and a third portion disposed at opposite sides of the first portion, and
a thickness of the second portion of the first insulation layer and a thickness of the third portion of the first insulation layer are different from each other.

10. The semiconductor device of claim 9, further comprising a second insulation layer that is disposed on the first insulation layer,
wherein the second insulation layer overlaps the first portion of the first insulation layer and does not overlap the second portion and the third portion of the first insulation layer.

11. The semiconductor device of claim 10, further comprising a first spacer that covers side surfaces of the bit line, side surfaces of the bit line capping layer, and side surfaces of the second insulation layer, and covers an upper surface of the first insulation layer.

12. The semiconductor device of claim 6, further comprising a first spacer that covers side surfaces of the bit line and side surfaces of the bit line capping layer and is disposed in the direct contact trench,
wherein a height of the first spacer disposed on a bottom surface of the second portion of the direct contact trench and a height of the first spacer disposed on a bottom surface of the third portion of the direct contact trench are different from each other.

13. A semiconductor device, comprising:
a substrate including an active region;
a word line that overlaps the active region;
a bit line structure that includes a bit line and a bit line capping layer overlapping both the active region and the word line;
a direct contact that is disposed in a direct contact trench formed in the substrate and electrically connects the active region and the bit line to each other;

a buried contact that is electrically connected to the active region;

a landing pad disposed on the buried contact;

an insulation pattern disposed at opposite sides of the landing pad; and a spacer structure that is disposed between the bit line structure and the buried contact and between the direct contact and the buried contact, wherein a first side of the bit line capping layer has a concave shape, and wherein a second side of the bit line capping layer has a flat shape at a level below the insulation pattern in a vertical direction.

14. The semiconductor device of claim 13, wherein the direct contact trench is formed in the substrate, the direct contact trench comprises:

a first portion where the direct contact is disposed; and a second portion and a third portion that are disposed at opposite sides of the first portion, and a height of a bottom surface of the second portion of the direct contact trench and a height of a bottom surface of the third portion of the direct contact trench are different from each other.

15. The semiconductor device of claim 13, further comprising:

an element isolation layer that is disposed in the substrate and defines the active region; and a first insulation layer that is disposed between the bit line and the element isolation layer, wherein the first insulation layer comprises:

a first portion overlapping the bit line; and a second portion and a third portion disposed at opposite sides of the first portion, and wherein a thickness of the second portion of the first insulation layer and a thickness of the third portion of the first insulation layer are different from each other.

* * * * *